United States Patent
Mizutani et al.

(10) Patent No.: US 7,379,158 B2
(45) Date of Patent: *May 27, 2008

(54) EXPOSURE APPARATUS AND METHOD FOR PRODUCING DEVICE

(75) Inventors: Hideo Mizutani, Yokohama (JP); Nobutaka Magome, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/350,787

(22) Filed: Feb. 10, 2006

(65) Prior Publication Data

US 2006/0126044 A1    Jun. 15, 2006

Related U.S. Application Data

(60) Division of application No. 11/147,288, filed on Jun. 8, 2005, which is a continuation of application No. PCT/JP03/15737, filed on Dec. 9, 2003.

(30) Foreign Application Priority Data

Dec. 10, 2002 (JP) ............................. 2002-357960
Nov. 25, 2003 (JP) ............................. 2003-393858

(51) Int. Cl.
    G03B 27/42    (2006.01)
    G03B 27/32    (2006.01)
(52) U.S. Cl. ......................................... 355/53; 355/77
(58) Field of Classification Search ............... 355/53, 355/30, 77
    See application file for complete search history.

(56) References Cited

U.S. PATENT DOCUMENTS

| | | |
|---|---|---|
| 4,346,164 A | 8/1982 | Tabarelli et al. |
| 4,468,120 A | 8/1984 | Tanimoto et al. |
| 4,480,910 A | 11/1984 | Takanashi et al. |
| 5,257,128 A | 10/1993 | Diller et al. |
| 5,587,794 A | 12/1996 | Mizutani et al. |
| 5,610,683 A | 3/1997 | Takahashi |
| 5,715,039 A | 2/1998 | Fukuda et al. |
| 5,825,043 A | 10/1998 | Suwa |
| 5,900,354 A | 5/1999 | Batchelder |
| 6,301,055 B1 | 10/2001 | Legrand et al. |

(Continued)

FOREIGN PATENT DOCUMENTS

DE    221 563 A1    4/1985

(Continued)

OTHER PUBLICATIONS

Immersion Lithography; its potential performance and issues, Soichi Owa et al., Optical Microlithography XVI, Proceedings of SPIE vol. 5040 (2003), pp. 724-733.

(Continued)

*Primary Examiner*—Rodney Fuller
(74) *Attorney, Agent, or Firm*—Oliff & Berridge, PLC

(57) ABSTRACT

A liquid immersion type exposure apparatus includes a projection optical system for projecting a pattern of a mask onto a substrate, a liquid film forming system for forming a liquid film in a predetermined region between the projection optical system and the substrate, and a sensor for detecting disappearance of at least a portion of the liquid film in the predetermined region.

49 Claims, 16 Drawing Sheets

U.S. PATENT DOCUMENTS

| | | |
|---|---|---|
| 6,788,477 B2 | 9/2004 | Lin |
| 2002/0163629 A1 | 11/2002 | Switkes et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0024609 A1 | 2/2005 | De Smit et al. |
| 2005/0030497 A1 | 2/2005 | Nakamura |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0141098 A1 | 6/2005 | Schuster |
| 2005/0190455 A1 | 9/2005 | Rostalski et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |

FOREIGN PATENT DOCUMENTS

| | | |
|---|---|---|
| DE | 224 448 A1 | 7/1985 |
| EP | 0 605 103 A1 | 7/1994 |
| EP | 0 834 773 A2 | 4/1998 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-04-305915 | 10/1992 |
| JP | A-4-305915 | 10/1992 |
| JP | A-4-305917 | 10/1992 |
| JP | A-04-305917 | 10/1992 |
| JP | A-05-62877 | 3/1993 |
| JP | A-5-62877 | 3/1993 |
| JP | A-05-296812 | 11/1993 |
| JP | A 05-304072 | 11/1993 |
| JP | A 06-124873 | 5/1994 |
| JP | A 06-168866 | 6/1994 |
| JP | A 07-220990 | 8/1995 |
| JP | A-07-220990 | 8/1995 |
| JP | A-8-316125 | 11/1996 |
| JP | A 10-154659 | 6/1998 |
| JP | A 10-255319 | 9/1998 |
| JP | A-10-303114 | 11/1998 |
| JP | A 10-303114 | 11/1998 |
| JP | A 10-340846 | 12/1998 |
| JP | A-10-340846 | 12/1998 |
| JP | A-11-176727 | 7/1999 |
| JP | A 11-176727 | 7/1999 |
| JP | A-2000-58436 | 2/2000 |
| JP | A 2000-058436 | 2/2000 |
| WO | WO 99/01797 | 1/1999 |
| WO | WO99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, Litho Forum, Jan. 28, 2004, "Update on 193 nm immersion exposure tool", S. Owa et al., 51 pages (slides 1-51).

Nikon Corporation, Immersion Lithography Workshop, Dec. 11, 2002, 24 pages (slides 1-24).

Nikon Corporation, Immersion Workshop, Jan. 27, 2004, "Update on 193 nm immersion exposure tool", S. Owa et al., 38 pages (slides 1-38).

Nikon Corporation, 3rd 157 nm symposium, Sep. 4, 2002, "Nikon F2 Exposure Tool", Soichi Owa et al., 25 pages (slides 1-25).

Optical Microlithography XVI, Proceedings of SPIE vol. 5040 (2003), "Immersion lithography; its potential performance and issues", Soichi Owa et al., pp. 724-733.

Nikon Corporation, NGL Workshop, Jul. 10, 2003, :Potential performance and feasibility of immersion lithography, Soichi Owa et al., 33 pages, slides 1-33.

Fig. 7A
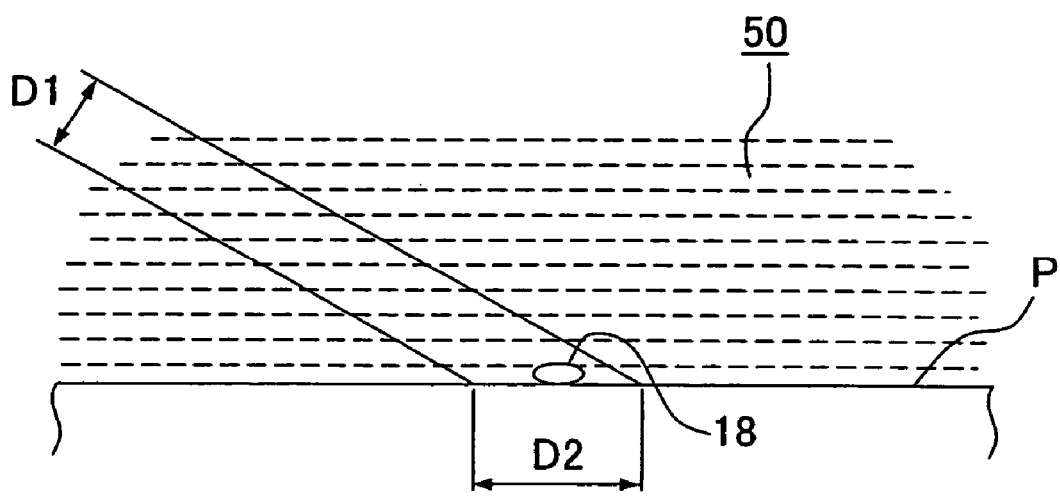
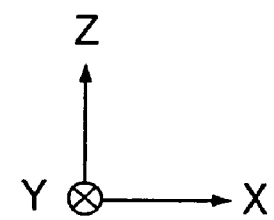
Fig. 7B
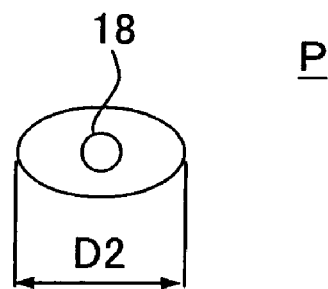

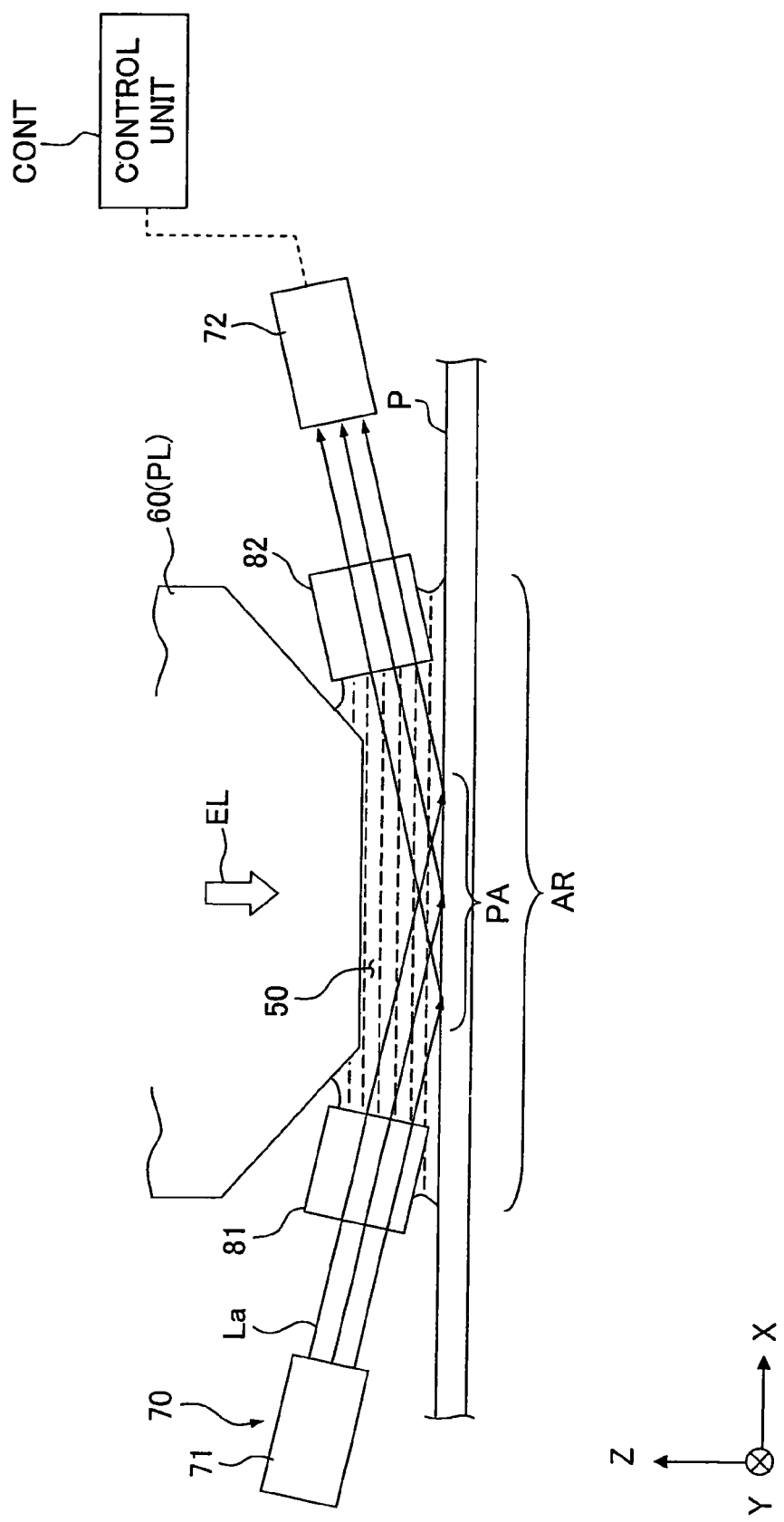

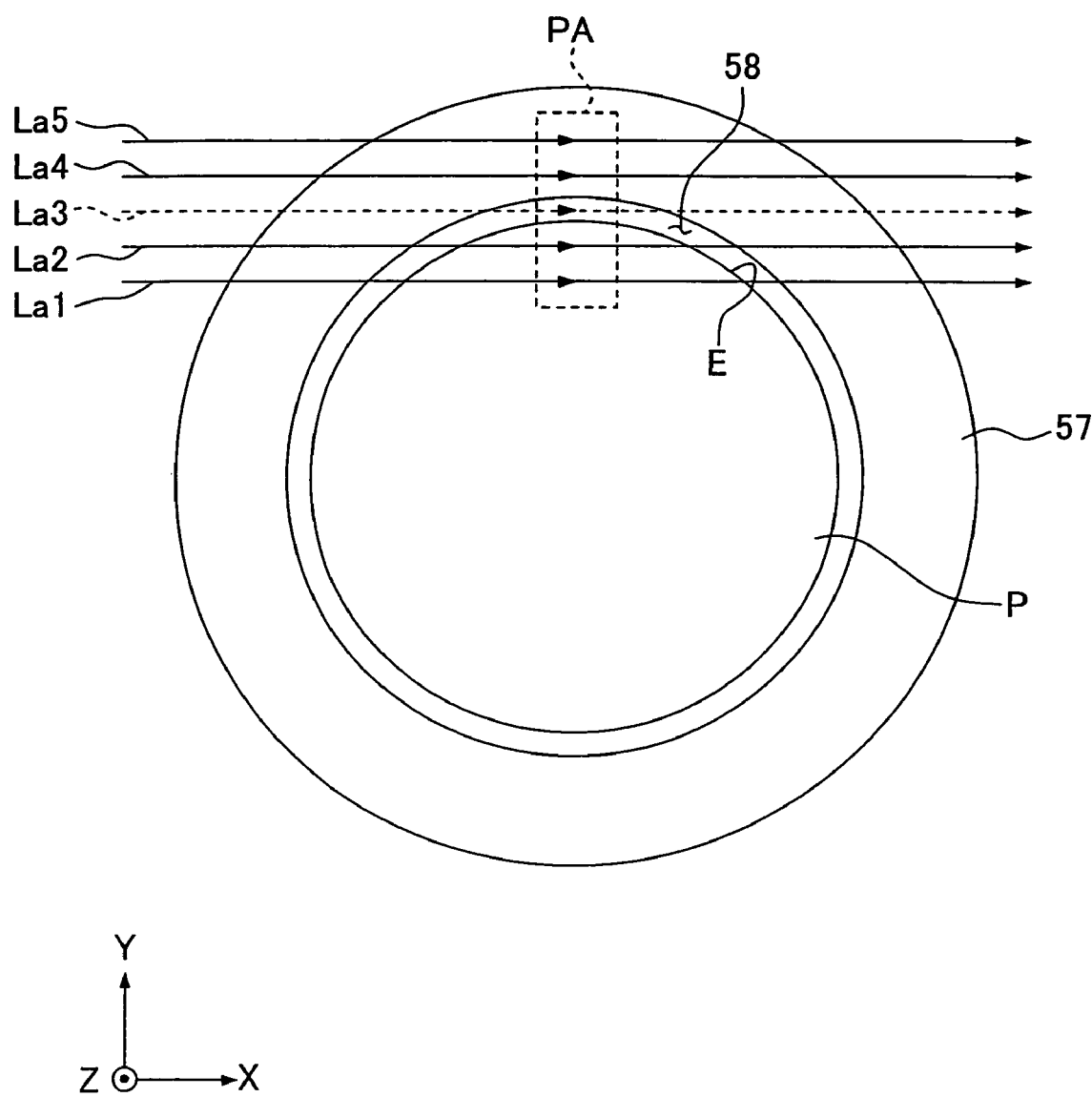

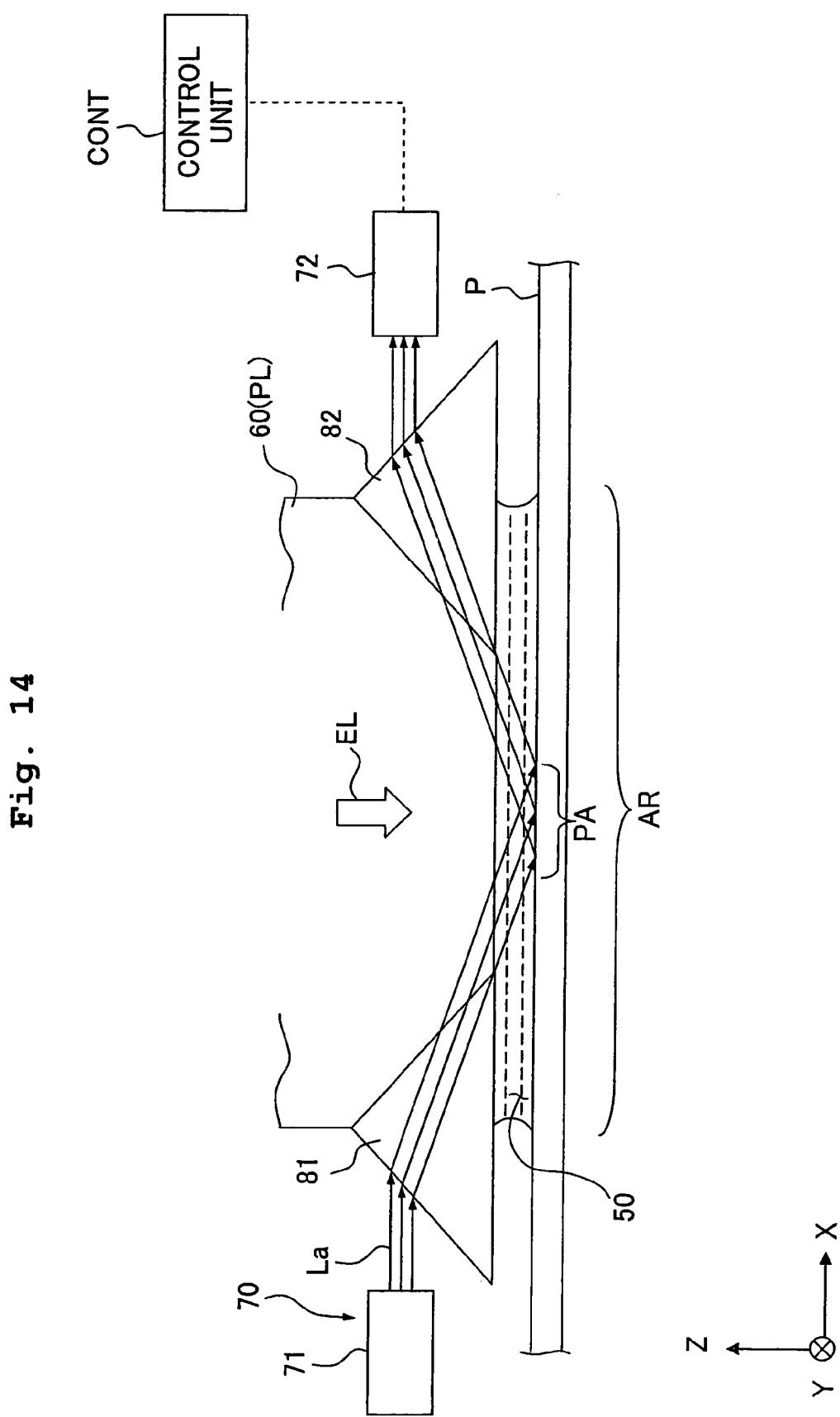

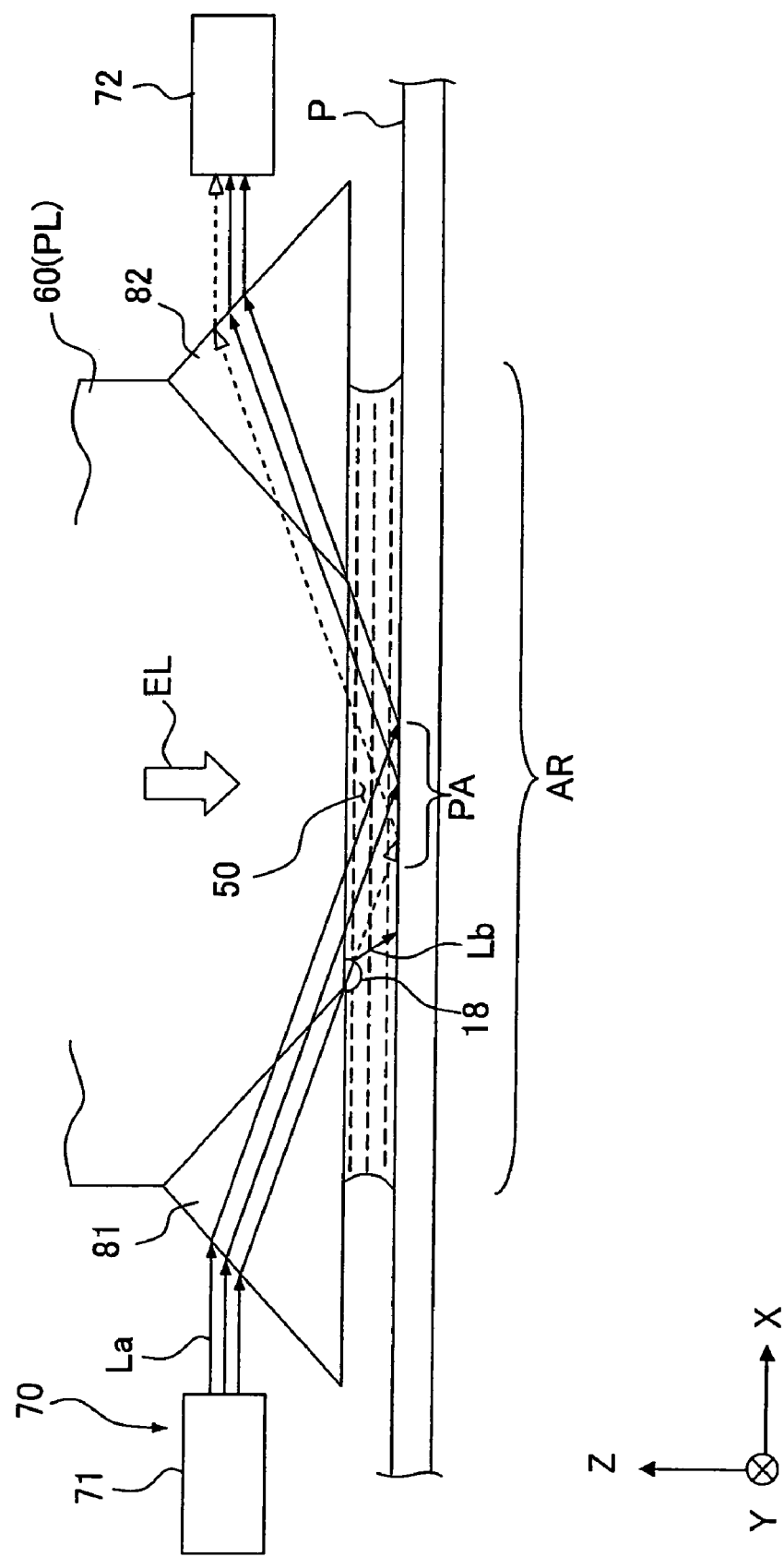

EXPOSURE APPARATUS AND METHOD FOR PRODUCING DEVICE

CROSS-REFERENCE

This application is a Divisional Application of U.S. patent application Ser. No. 11/147,288 filed Jun. 8, 2005, which in turn is a Continuation of International Application No. PCT/JP03/015737 filed Dec. 9, 2003 and which claims the conventional priority of Japanese patent Application Nos. 2002-357960 filed on Dec. 10, 2002 and 2003-393858 filed on Nov. 25, 2003. The disclosures of these prior applications are incorporated herein by reference in their entireties.

BACKGROUND OF THE INVENTION

1. Field of the Invention

The present invention relates to an exposure apparatus for exposing a substrate with a pattern image projected by a projection optical system in a state in which at least a part of a space between the projection optical system and the substrate is filled with a liquid. The present invention also relates to a method for producing a device based on the use of the exposure apparatus.

2. Description of the Related Art

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used becomes shorter, the resolution of the projection optical system is higher. As the numerical aperture of the projection optical system becomes larger, the resolution of the projection optical system is higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to utilize the fact that the wavelength of the exposure light beam in the liquid is 1/n as compared with that in the air (n represents the refractive index of the liquid, which is about 1.2 to 1.6 in ordinary cases) so that the resolution is improved and the depth of focus is magnified about n times.

When the exposure process is performed by the liquid immersion method, if any gas portion such as bubbles or the like exists in the liquid (especially on the substrate surface) between the projection optical system and the substrate, it is feared that a pattern image to be formed on the substrate may be deteriorated by the influence of the bubble (gas portion). Such a situation is not limited, for example, to only the case in which the bubble is contained in the liquid to be supplied, but there is also such a possibility that the bubble may be formed in the liquid after the supply. If the image formation failure of the pattern image as described above is left as it is, the failure is consequently found out as a defective product at the stage at which the final device is produced. It is feared that the device productivity may be lowered.

On the other hand, the following situation is also assumed. That is, the gas portion is formed by causing such a state that at least a part of the space between the projection optical system and the substrate is not filled with the liquid due to any cause, for example, any malfunction of a liquid supply unit for supplying the liquid to the space between the projection optical system and the substrate when the exposure process is performed on the basis of the liquid immersion method. That is, it is feared that all of the pattern image or a part thereof may be projected onto the substrate without passing through or not through the liquid. In this situation, there is such a possibility that the pattern image may not be formed on the substrate. If such a situation is left as it is, then it is impossible to found out the defect until the final device is produced, and it is feared that the productivity may be lowered.

In the case of the exposure apparatus based on the use of the liquid immersion method, various measurement operations are sometimes performed via the liquid disposed on the image plane side of the projection optical system. However, if the gas portion exists on the image plane side of the projection optical system, and the space is not filled with a sufficient amount of the liquid, then there is such a possibility that the measurement error appears, and/or it is impossible to perform the measurement in some situations.

SUMMARY OF THE INVENTION

The present invention has been made taking the foregoing circumstances into consideration, an object of which is to provide an exposure apparatus which makes it possible to suppress the decrease in productivity even when the liquid immersion method is used, and a method for producing a device based on the use of the exposure apparatus. Another object of the present invention is to provide an exposure apparatus which makes it possible to detect, for example, any deterioration of a pattern image caused by any bubble in a liquid when the exposure process is performed while filling the space between a projection optical system and a substrate with the liquid, and a method for producing a device based on the use of the exposure apparatus. Still another object of the present invention is to provide an exposure apparatus which makes it possible to suppress the decrease in productivity caused by the fact that the space between a projection optical system and a substrate is not filled with a liquid, and a method for producing a device based on the use of the exposure apparatus. Still another object of the present invention is to provide an exposure apparatus which makes it possible to suppress the occurrence of, for example, any exposure failure and/or any measurement failure even when the liquid immersion method is used, and a method for producing a device based on the use of the exposure apparatus.

In order to achieve the objects as described above, the present invention adopts the following constructions corresponding to FIGS. 1 to 16 as illustrated in embodiments. However, parenthesized numerals or symbols affixed to respective elements merely exemplify the elements by way of example, with which it is not intended to limit the respective elements.

According to a first aspect of the present invention, there is provided an exposure apparatus (EX) which exposes a substrate (P) by transferring an image of a pattern through a liquid (50) onto the substrate (P), the exposure apparatus comprising:

a projection optical system (PL) which projects the image of the pattern onto the substrate (P); and a bubble detector (20) which detects a bubble in the liquid (50) between the projection optical system (PL) and the substrate (P).

According to the present invention, when the exposure process is performed on the basis of the liquid immersion method, the bubble is detected in the liquid between the projection optical system and the substrate by the aid of the bubble detector. Accordingly, it is possible to detect the information about the bubble in the liquid between the projection optical system and the substrate, as the portion which greatly concerns the pattern transfer accuracy. The exposure failure (defective shot) can be recognized on the basis of the result of the detection. Therefore, it is possible to apply an appropriate treatment in order to maintain the high device productivity.

According to a second aspect of the present invention, there is provided an exposure apparatus (EX) which exposes a substrate (P) by transferring an image of a pattern through a liquid (50) onto the substrate (P), the exposure apparatus comprising:

a projection optical system (PL) which projects the image of the pattern onto the substrate (P); and a liquid shortage detector (20) which detects shortage of the liquid (50) between the projection optical system (PL) and the substrate (P).

According to the present invention, when the exposure process is performed on the basis of the liquid immersion method, it is possible to detect whether or not the liquid, with which the space between the projection optical system and the substrate is filled, is insufficient, by the aid of the liquid shortage detector. Therefore, it is possible to recognize, at an early stage, the occurrence of the exposure failure and the defective shot on the basis of the result of the detection. It is possible to apply an appropriate treatment in order not to produce any defective device which would be otherwise produced due to the liquid shortage. For example, when any water shortage is detected, the exposure is performed after solving the water shortage. Thus, it is possible to suppress the occurrence of the exposure failure and the defective shot.

According to a third aspect of the present invention, there is provided an exposure apparatus (EX) which exposes a substrate by radiating an exposure light beam onto the substrate (P) via a projection optical system (PL) and through a liquid (50), the exposure apparatus comprising:

a gas-detecting system (70) which detects a presence or absence of a gas portion in an optical path for the exposure light beam.

According to the present invention, the gas-detecting system is used to detect the presence or absence of the gas portion in the optical path for the exposure light beam. Accordingly, for example, it is possible to recognize whether or not any defective shot or any image formation failure of the pattern image appears resulting from the gas portion during the exposure for the substrate. Accordingly, it is possible to apply an appropriate treatment in order to maintain the high device productivity. The exposure can be started for the substrate after confirming the fact that the gas portion is absent in the optical path for the exposure light beam. Therefore, it is also possible to suppress the production of any defective device.

According to a fourth aspect of the present invention, there is provided an exposure apparatus (EX) which exposes a substrate (P) by radiating an exposure light beam onto the substrate (P) via a projection optical system (PL) and through a liquid (50), the exposure apparatus comprising:

a surface position-detecting system (70) which detects a surface position of the substrate by projecting a detecting light beam onto the substrate through the liquid (50) on the substrate and receiving the detecting light beam reflected on the substrate, wherein:

a presence or absence of a gas portion in an optical path for the detecting light beam is detected on the basis of an output of the surface position-detecting system (70).

According to the present invention, the surface position-detecting system, which detects the surface position information about.the substrate through the liquid, is used to detect the presence or absence of the gas portion in the optical path for the detecting light beam. Accordingly, for example, it is possible to recognize whether or not any defective shot or any image formation failure of the pattern image appears resulting from the gas portion during the exposure for the substrate. Accordingly, it is possible to apply an appropriate treatment in order to maintain the high device productivity. When the surface position-detecting system is used also as the gas-detecting system for detecting the presence or absence of the gas portion, it is possible to detect the presence or absence of the gas portion without complicating the arrangement of the apparatus.

According to still another aspect of the present invention, there is provided a method for producing a device, comprising using the exposure apparatus (EX) according to any one of the aspects described above.

BRIEF DESCRIPTION OF THE DRAWINGS

FIGS. 7A and 7B are diagrams explaining a detecting light beam emitted by the bubble detector.

FIG. 8 shows an embodiment of a gas-detecting system according to the present invention.

FIG. 13 schematically illustrates the gas-detecting system according to the present invention.

FIG. 14 shows an embodiment of a gas-detecting system according to the present invention.

FIG. 15 shows an operation for detecting a gas portion, performed by the gas-detecting system according to the present invention.

DESCRIPTION OF THE PREFERRED EMBODIMENTS OF THE INVENTION

Figure 1:
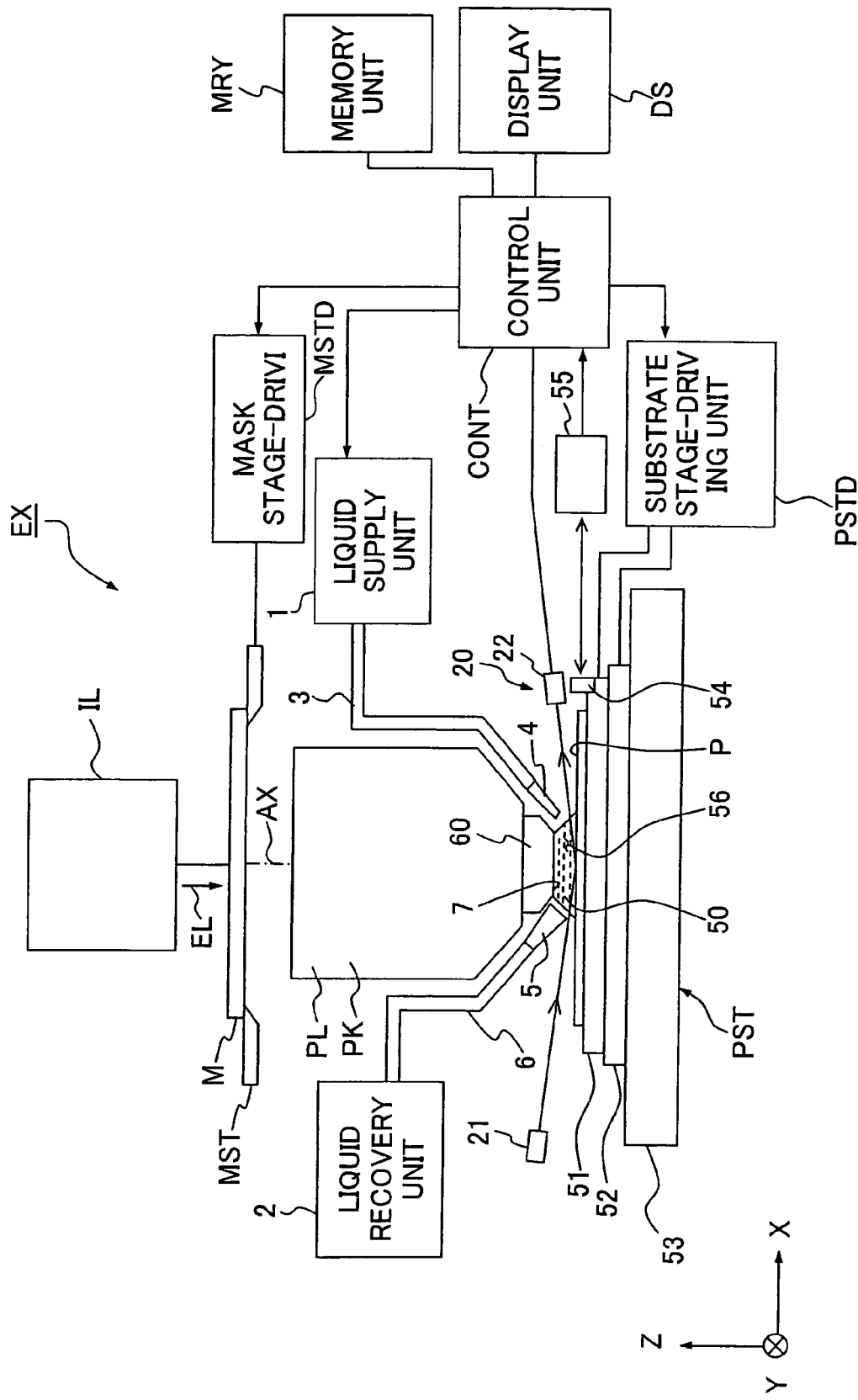
FIG. 1 shows a schematic arrangement illustrating an embodiment of an exposure apparatus of the present invention.

An explanation will be made below about the exposure apparatus and the method for producing the device according to the present invention with reference to the drawings. However, the present invention is not limited thereto. FIG. 1 shows a schematic arrangement illustrating an embodiment of the exposure apparatus of the present invention.

With reference to FIG. 1, an exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, a control unit CONT which collectively controls the overall operation of the exposure apparatus EX, a memory unit MRY which is connected to the control unit CONT and which stores information about the exposure process, and a display unit DS which displays information about the exposure process.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction resides in the direction which is coincident with the optical axis AX of the projection optical system PL, the X axis direction resides in the synchronous movement direction (scanning direction) for the mask M and the substrate P in the plane perpendicular to the Z axis direction, and the Y axis direction resides in the direction (non-scanning direction) perpendicular to the Z axis direction and the Y axis direction. The directions about the X axis, the Y axis, and the Z axis are designated as θX, θY, and θZ directions respectively. The term "substrate" referred to herein includes those obtained by applying a resist on a semiconductor wafer, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, bright lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. The position in the two-dimensional direction and the angle of rotation of the mask M on the mask stage MST are measured in real-time by a laser interferometer. The result of the measurement is outputted to the control unit CONT. The control unit CONT drives the mask stage-driving unit MSTD on the basis of the result of the measurement obtained by the laser interferometer to thereby position the mask M supported on the mask stage MST.

The projection optical system PL projects the pattern on the mask M onto the substrate P at a predetermined projection magnification β to perform the exposure. The projection optical system PL includes a plurality of optical elements (lenses). The optical elements are supported by a barrel PK as a metal member. In this embodiment, the projection optical system PL is based on the reduction system having the projection magnification β which is, for example, 1/4 or 1/5. The projection optical system PL may be any one of the 1x magnification system and the magnifying system. The optical element (lens) 60 is exposed from the barrel PK on the side of the tip (on the side of the substrate P) of the projection optical system PL of this embodiment. The optical element 60 is provided detachably (exchangeably) with respect to the barrel PK.

The substrate stage PST supports the substrate P. The substrate stage PST includes a Z stage 51 which retains the substrate P by the aid of a substrate holder, an XY stage 52 which supports the Z stage 51, and a base 53 which supports the XY stage 52. The substrate stage PST is driven by a substrate stage-driving unit PSTD such as a linear motor.

The substrate stage-driving unit PSTD is controlled by the control unit CONT. When the Z stage 51 is driven, the substrate P, which is retained on the Z stage 51, is subjected to the control of the position (focus position) in the Z axis direction and the positions in the θX and θY directions. When the XY stage 52 is driven, the substrate P is subjected to the control of the position in the XY directions (position in the directions substantially parallel to the image plane of the projection optical system PL). That is, the Z stage 51 controls the focus position and the angle of inclination of the substrate P so that the surface of the substrate P is adjusted to match the image plane of the projection optical system PL in the auto-focus manner and the auto-leveling manner. The XY stage 52 positions the substrate P in the X axis direction and the Y axis direction. It goes without saying that the Z stage and the XY stage may be provided in an integrated manner.

A movement mirror 54, which is movable together with the substrate stage PST with respect to the projection optical system PL, is provided on the substrate stage PST (Z stage 51). A laser interferometer 55 is provided at a position opposed to the movement mirror 54. The angle of rotation and the position in the two-dimensional direction of the substrate P on the substrate stage PST are measured in real-time by the laser interferometer 55. The result of the measurement is outputted to the control unit CONT. The control unit CONT drives the substrate stage-driving unit PSTD on the basis of the result of the measurement of the laser interferometer 55 to thereby position the substrate P supported on the substrate stage PST.

In this embodiment, the liquid immersion method is applied in order that the resolution is improved by substantially shortening the exposure wavelength and the depth of focus is substantially widened. Therefore, the space between the surface of the substrate P and the tip surface (lower surface) 7 of the optical element (lens) 60 of the projection optical system PL on the side of the substrate P is filled with the predetermined liquid 50 at least during the period in which the image of the pattern on the mask M is transferred onto the substrate P. As described above, the lens 60 is exposed on the tip side of the projection optical system PL, and the liquid 50 is designed to make contact with only the lens 60. Accordingly, the barrel PK composed of the metal is prevented from any corrosion or the like. In this embodiment, pure water is used for the liquid 50. The exposure light beam EL, which is not limited only to the ArF excimer laser beam, can be transmitted through pure water, even when the exposure light beam EL is, for example, the bright line (g-ray, h-ray, i-ray) in the ultraviolet region radiated, for example, from a mercury lamp or the far ultraviolet light beam (DUV light beam) such as the KrF excimer laser beam (wavelength: 248 nm).

The exposure apparatus EX includes a liquid supply unit 1 which supplies the predetermined liquid 50 to the space 56 between the substrate P and the tip surface (end surface of the lens 60) 7 of the projection optical system PL, and a liquid recovery unit 2 which recovers the liquid 50 from the space 56. The liquid supply unit 1 is provided to fill at least a part of the space between the projection optical system PL and the substrate P with the liquid 50. The liquid supply unit 1 includes, for example, a tank for accommodating the liquid 50, and a pressurizing pump. One end of a supply tube 3 is connected to the liquid supply unit 1. Supply nozzles 4 are connected to the other end of the supply tube 3. The liquid supply unit 1 supplies the liquid 50 to the space 56 through the supply tube 3 and the supply nozzles 4. The liquid supply unit 1 establishes the temperature of the liquid 50 to be supplied to the space 56 so that the temperature is approximately equivalent, for example, to the temperature (for example, 23° C.) in the chamber in which the exposure apparatus EX is accommodated.

The liquid recovery unit 2 includes, for example, a suction pump, and a tank for accommodating the recovered liquid 50. One end of a recovery tube 6 is connected to the liquid recovery unit 2. Recovery nozzles 5 are connected to the other end of the recovery tube 6. The liquid recovery unit 2 recovers the liquid 50 from the space 56 through the recovery nozzles 5 and the recovery tube 6. When the space 56 is filled with the liquid 50, then the control unit CONT drives the liquid supply unit 1 so that the liquid 50, which is in a predetermined amount per unit time, is supplied to the space 56 through the supply tube 3 and the supply nozzles 4, and the control unit CONT drives the liquid recovery unit 2 so that the liquid 50, which is in a predetermined amount per unit time, is recovered from the space 56 through the recovery nozzles 5 and the recovery tube 6. Accordingly, the liquid 50 is retained in the space 56 between the substrate P and the tip surface 7 of the projection optical system PL.

The exposure apparatus EX is provided with a bubble detector 20 which detects any bubble contained in the liquid 50 in the space 56 between the projection optical system PL and the substrate P. The bubble detector 20 optically detects the bubble contained in the liquid 50. The bubble detector 20 includes a projecting system 21 which projects a detecting light beam onto the liquid 50 in the space 56, and a light-receiving system 22 which receives the detecting light beam coming from the liquid 50 in the space 56. The projecting system 21 projects the detecting light beam in a direction inclined with respect to the surface of the substrate P, and thus the detecting light beam is projected onto the liquid 50 in the space. The projecting system 21 projects the detecting light beam onto the surface of the substrate P from a position separated in the X axis direction as the scanning direction for the substrate P with respect to the optical axis AX of the projection optical system PL. In this embodiment, the projecting system 21 is provided at the position separated in the –X direction with respect to the optical axis AX of the projection optical system PL. The light-receiving system 22 is provided at a position separated in the +X direction with respect to the optical axis AX of the projection optical system PL.

Figure 2:
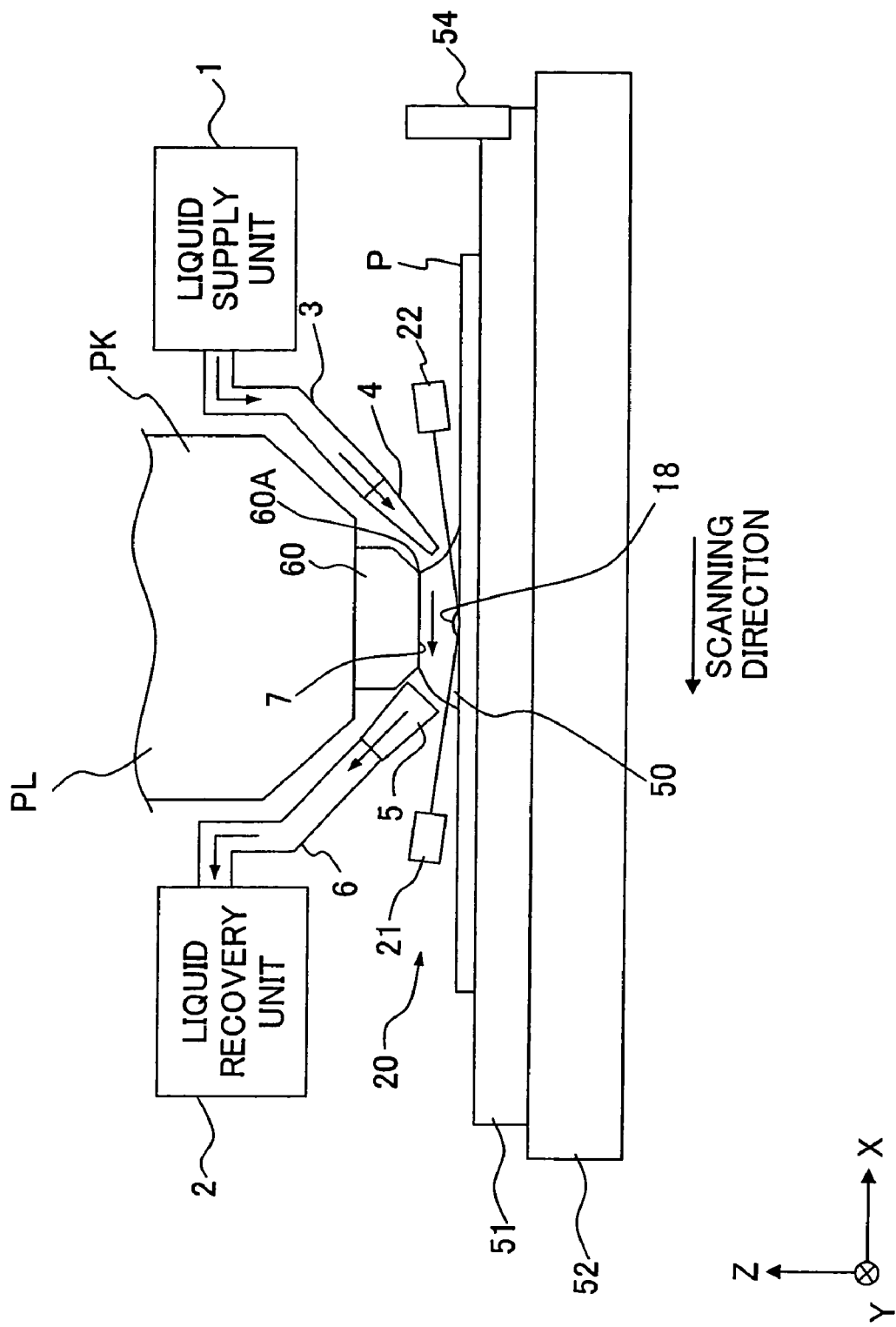
FIG. 2 shows a positional relationship among a tip of a projection optical system, a liquid supply unit, and a liquid recovery unit.

FIG. 2 shows a partial magnified view of FIG. 1 illustrating, for example, the lower portion of the projection optical system PL of the exposure apparatus EX, the liquid supply unit 1, and the liquid recovery unit 2. In FIG. 2, the lens 60, which is disposed at the lowest end of the projection optical system PL, is formed to have a rectangular shape which is long in the Y axis direction (non-scanning direction) while remaining only the portion required for the end portion 60A in the scanning direction. During the scanning exposure, a pattern image of a part of the mask M is projected onto the rectangular projection area disposed just under the end portion 60A. The mask M is moved at the velocity V in the –X direction (or in the +X direction) with respect to the projection optical system PL, in synchronization with which the substrate P is moved at the velocity β·V (β is the projection magnification) in the +X direction (or in the –X direction) by the aid of the XY stage 52. After the completion of the exposure for one shot area, the next shot area is moved to the scanning start position in accordance with the stepping of the substrate P. The exposure process is successively performed thereafter for each of the shot areas in accordance with the step-and-scan system. This embodiment is designed so that the liquid 50 is allowed to flow in parallel to the scanning direction of the substrate P.

Figure 3:
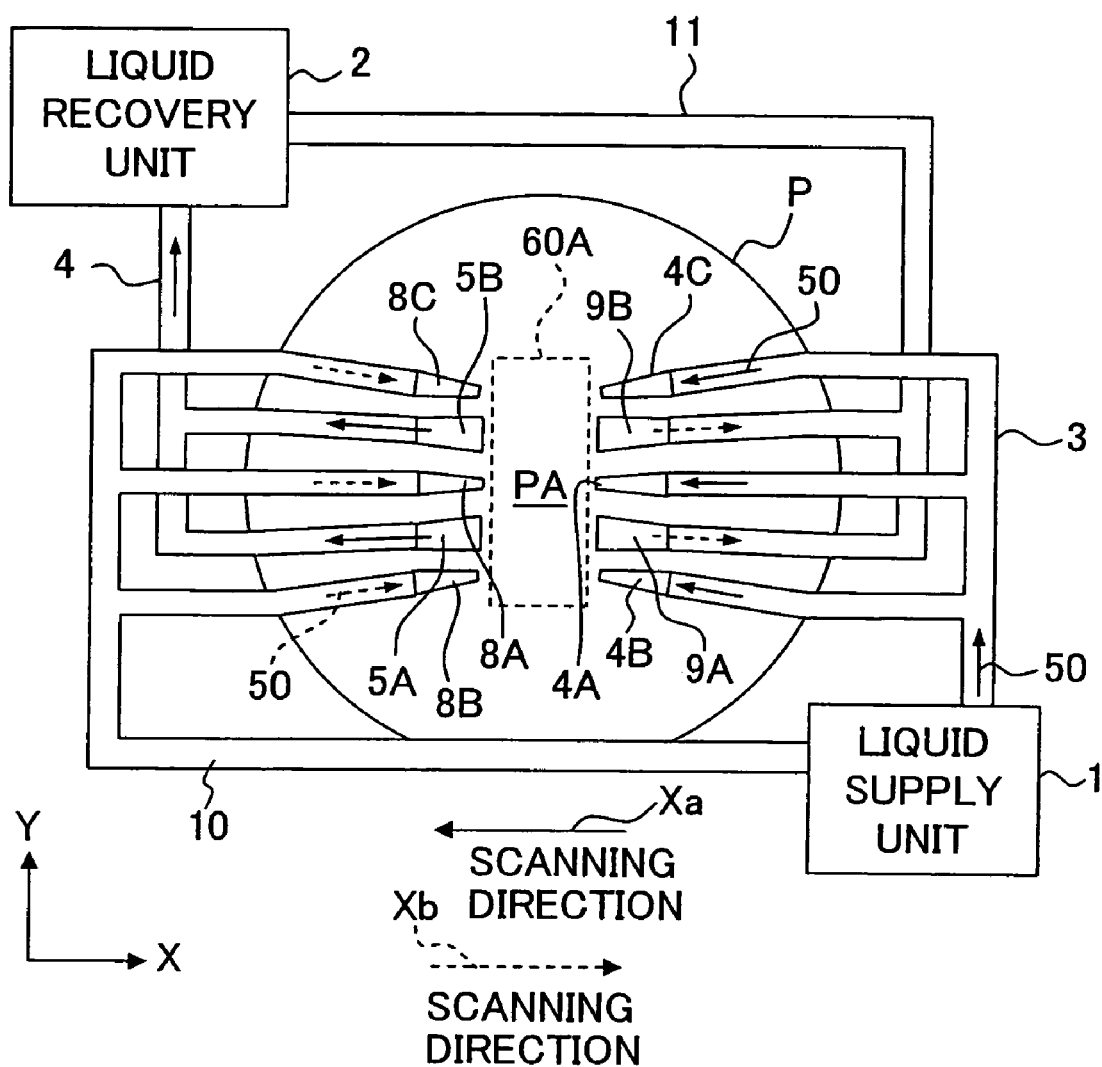
FIG. 3 shows an exemplary arrangement of supply nozzles and recovery nozzles.

FIG. 3 shows the positional relationship among the end portion 60A of the lens 60 of the projection optical system PL, the supply nozzles 4 (4A to 4C) for supplying the liquid 50 in the X axis direction, and the recovery nozzles 5 (5A, 5B) for recovering the liquid 50. In FIG. 3, the end portion 60A of the lens 60 has a rectangular shape which is long in the Y axis direction. The three supply nozzles 4A to 4C are arranged on the side in the +X direction, and the two recovery nozzles 5A, 5B are arranged on the side in the −X direction so that the end portion 60A of the lens 60 of the projection optical system PL is interposed thereby. The supply nozzles 4A to 4C are connected to the liquid supply unit 1 via the supply tube 3, and the recovery nozzles 5A, 5B are connected to the liquid recovery unit 2 via the recovery tube 4. Further, the supply nozzles 8A to 8C and the recovery nozzles 9A, 9B are arranged at positions obtained by rotating, by substantially 180°, the positions of the supply nozzles 4A to 4C and the recovery nozzles 5A, 5B about the center of the end portion 60A. The supply nozzles 4A to 4C and the recovery nozzles 9A, 9B are alternately arranged in the Y axis direction. The supply nozzles 8A to 8C and the recovery nozzles 5A, 5B are alternately arranged in the Y axis direction. The supply nozzles 8A to 8C are connected to the liquid supply unit 1 via the supply tube 10. The recovery nozzles 9A, 9B are connected to the liquid recovery unit 2 via the recovery tube 11.

When the scanning exposure is performed by moving the substrate P in the scanning direction (−X direction) indicated by the arrow Xa (see FIG. 3), the liquid 50 is supplied and recovered with the liquid supply unit 1 and the liquid recovery unit 2 by using the supply tube 3, the supply nozzles 4A to 4C, the recovery tube 4, and the recovery nozzles 5A, 5B. That is, when the substrate P is moved in the −X direction, then the liquid 50 is supplied to the space between the projection optical system PL and the substrate P from the liquid supply unit 1 by the aid of the supply tube 3 and the supply nozzles 4 (4A to 4C), and the liquid 50 is recovered to the liquid recovery unit 2 by the aid of the recovery nozzles 5 (5A, 5B) and the recovery tube 6. The liquid 50 flows in the −X direction so that the space between the lens 60 and the substrate P is filled therewith. On the other hand, when the scanning exposure is performed by moving the substrate P in the scanning direction (+X direction) indicated by the arrow Xb, then the liquid 50 is supplied and recovered with the liquid supply unit 1 and the liquid recovery unit 2 by using the supply tube 10, the supply nozzles 8A to 8C, the recovery tube 11, and the recovery nozzles 9A, 9B. That is, when the substrate P is moved in the +X direction, then the liquid 50 is supplied from the liquid supply unit 1 to the space between the projection optical system PL and the substrate P by the aid of the supply tube 10 and the supply nozzles 8 (8A to 8C), and the liquid 50 is recovered to the liquid recovery unit 2 by the aid of the recovery nozzles 9 (9A, 9B) and the recovery tube 11. The liquid 50 flows in the +X direction so that the space between the lens 60 and the substrate P is filled therewith. As described above, the control unit CONT allows the liquid 50 to flow in the same direction as the movement direction of the substrate P in accordance with the movement direction of the substrate P by using the liquid supply unit 1 and the liquid recovery unit 2. In this arrangement, for example, the liquid 50, which is supplied from the liquid supply unit 1 via the supply nozzles 4, flows so that the liquid 50 is attracted and introduced into the space 56 in accordance with the movement of the substrate P in the −X direction. Therefore, even when the supply energy of the liquid supply unit 1 is small, the liquid 50 can be supplied to the space 56 with ease. When the direction, in which the liquid 50 is allowed to flow, is switched depending on the scanning direction, then it is possible to fill the space between the substrate P and the tip surface 7 of the lens 60 with the liquid 50, and it is possible to obtain the high resolution and the wide depth of focus, even when the substrate P is subjected to the scanning in any one of the +X direction and the −X direction.

Figure 4:
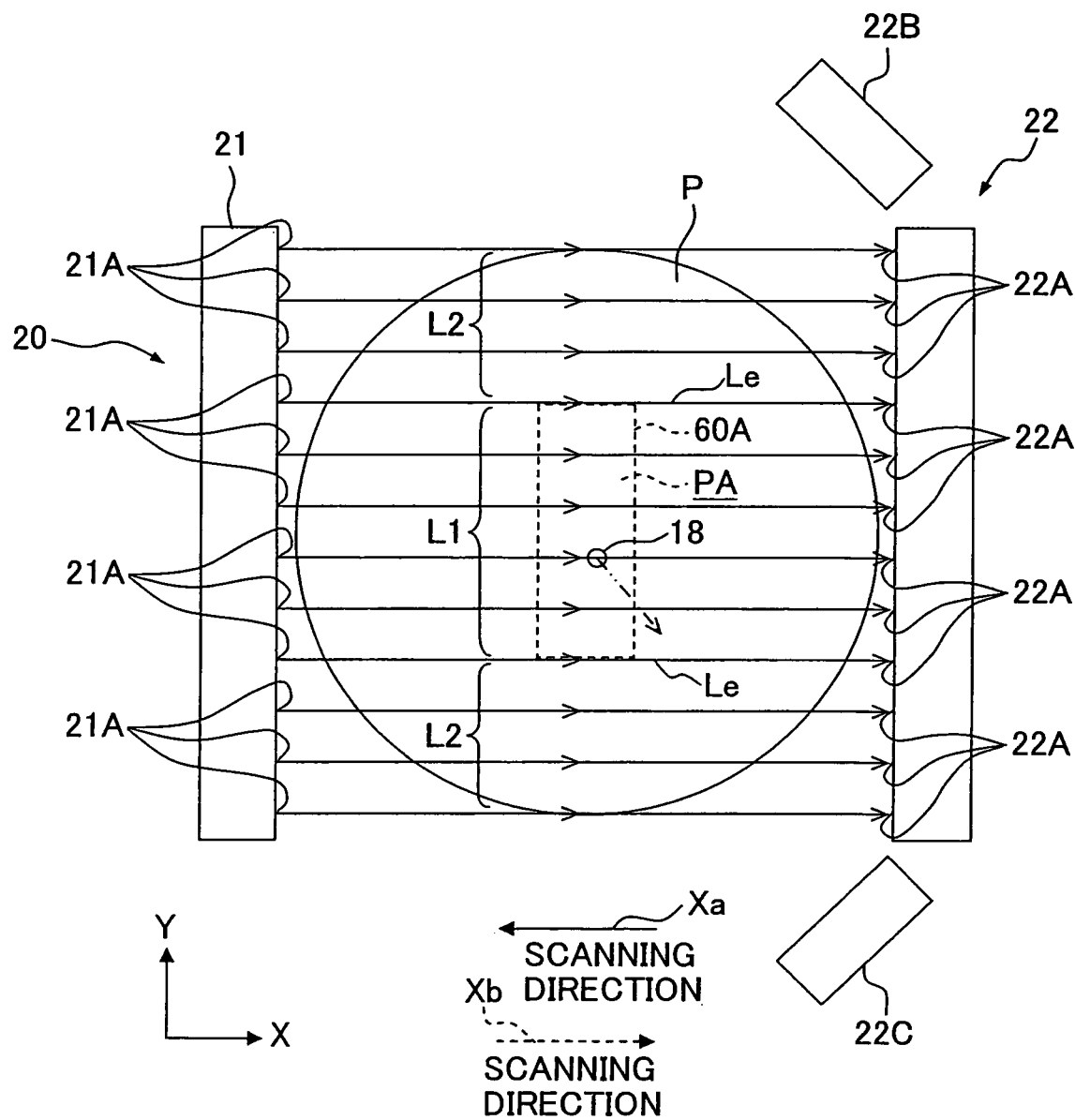
FIG. 4 shows a plan view illustrating a bubble detector.

FIG. 4 shows a plan view illustrating a schematic arrangement of the bubble detector 20. The projecting system 21 and the light-receiving system 22 are provided to interpose, in the X axis direction, the end portion 60A of the lens 60 of the projection optical system PL, i.e., the projection area PA of the projection optical system PL on the substrate P. The projecting system 21 has a plurality of projectors 21A which are aligned in the Y axis direction. The detecting light beams are projected onto the substrate P from the respective projectors 21A. The detecting light beams, which are projected from the plurality of projectors 21A, are set to have an identical angle of incidence with respect to the surface of the substrate P respectively. The light-receiving system 22 has a plurality of light-receivers 22A corresponding to the projectors 21A of the projecting system 21. The detecting light beam, which is projected from each of the projectors 21A, passes through the liquid 50 when no bubble is contained in the liquid. Accordingly, the detecting light beam is reflected by the surface of the substrate P, and it is received by each of the light-receivers 22A.

The light-receiving system 22 has light-receivers 22B, 22C which are arranged at positions at which no detecting light beam from the projecting system 21 directly comes into the light-receivers 22B, 22C, respectively. Any scattered light, which is generated when the detecting light beam from the projecting system 21 collides with the bubble in the liquid to make reflection when the bubble is present in the liquid, is received (subjected to the dark field detection) by the light-receivers 22A, 22C.

Parts of the detecting light beams L1, which are included in the plurality of detecting light beams emitted from the projecting system 21, are projected onto the area on the substrate P corresponding to the end portion 60A of the lens 60 (projection area PA of the projection optical system PL). Remaining detecting light beams L2 are projected onto the areas disposed on the both outer sides in the Y axis direction of the projection area PA. The projecting system 21 projects at least parts of the detecting light beams Le of in the plurality of detecting light beams, onto areas or portions disposed in the vicinity of the boundary portions in the Y axis direction of the projection area PA. The liquid 50 is supplied from the liquid supply unit 1 to the portion corresponding to the space between the substrate P and the end portion 60A of the lens 60, i.e., the projection area PA on the substrate P. Therefore, the portion, which corresponds to the projection area PA, is the liquid immersion portion.

FIG. 7A schematically shows, as viewed from a side position, a state in which the detecting light beam is radiated onto the bubble 18 adhered to the surface of the substrate P, and FIG. 7B shows a plan view of FIG. 7A.

As shown in FIG. 7A, for example, when the detecting light beam is a spot light beam, and the light flux thereof has a diameter of D1, then the detecting light beam on the substrate P is elliptical with the longitudinal direction of the X axis direction (scanning direction) as shown in FIG. 7B, when the detecting light beam is projected in a direction inclined with respect to the substrate P. The size D2 in the longitudinal direction of the elliptical detecting area for the detecting light beam on the substrate P is larger than the diameter D1. That is, for example, when the detecting light beam is radiated in a direction perpendicular to the surface of the substrate P, the size in the X axis direction of the detecting area for the detecting light beam is D1. However, when the detecting light beam is radiated in the inclined direction, the bubble 18 can be detected with the detecting area having the size of D2 which is larger than D1 in the X axis direction. Therefore, when the bubble 18 is detected on the substrate P which is to be subjected to the scanning in the X axis direction, then the bubble 18 is detected with the detecting area which is wider than the detecting area having the diameter D1, and it is possible for the bubble detector 20 to improve the detection accuracy for the bubble 18. The explanation has been made assuming that the detecting light beam is the spot light beam. However, an equivalent effect is also obtained even when the detecting light beam is a slit light beam.

Figure 5:
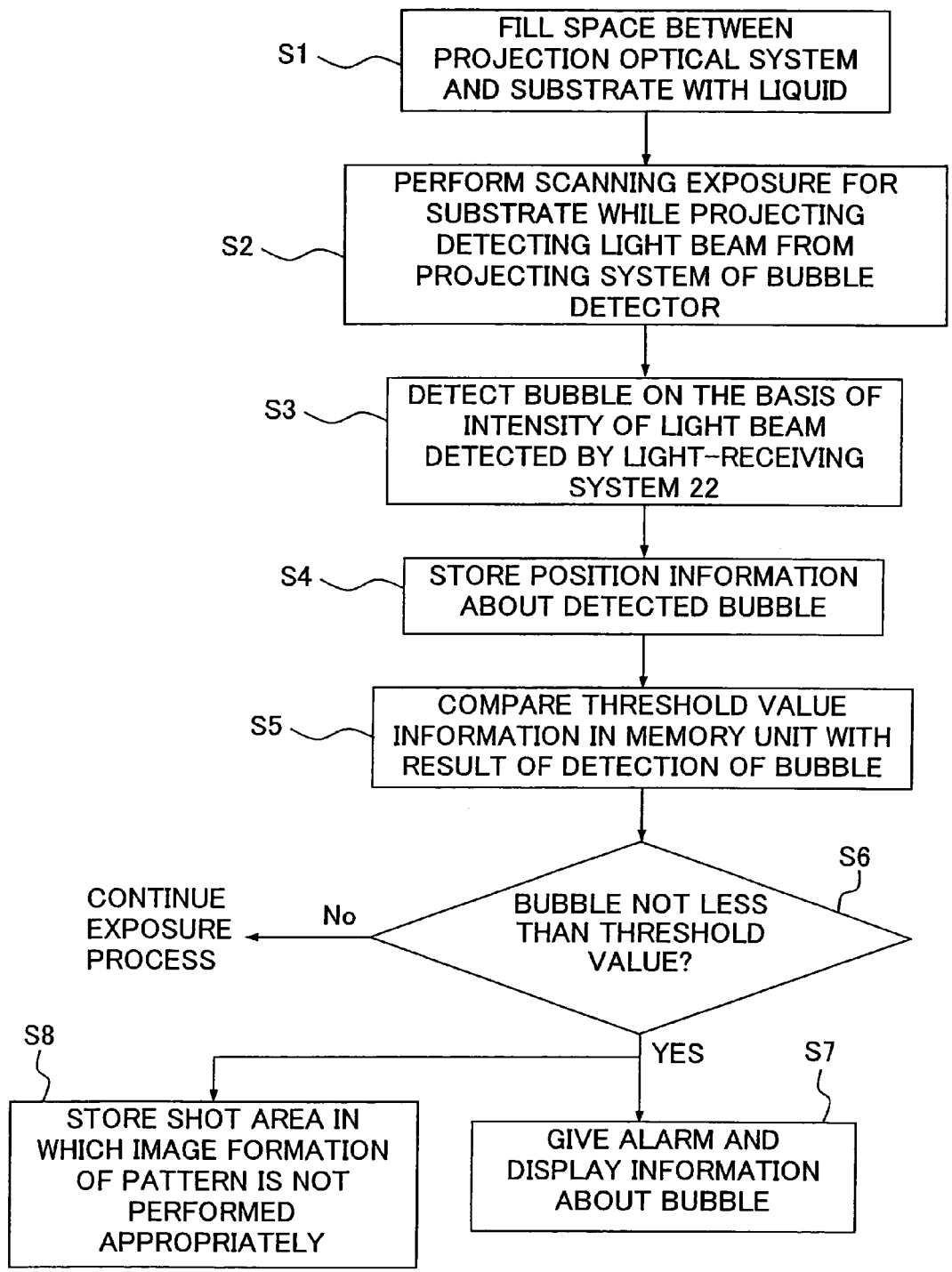
FIG. 5 shows a flow chart illustrating an exemplary procedure of bubble detection.

Next, an explanation will be made with reference to a flow chart shown in FIG. 5 about a procedure for exposing the substrate P with the pattern of the mask M through the projection optical system PL and the liquid 50 by using the exposure apparatus EX constructed as described above.

At first, the mask M is loaded on the mask stage MST, and the substrate P is loaded on the substrate stage PST. Subsequently, the control unit CONT drives the liquid supply unit 1 and the liquid recovery unit 2 to start the liquid supply operation to the space 56. Accordingly, the space between the lower surface 7 (end portion 60A) of the projection optical system PL and the projection area PA of the substrate P is filled with the liquid 50 (Step S1).

Subsequently, the control unit CONT drives the substrate stage PST to scan the substrate P in the X direction, while the mask M is illuminated with the exposure light beam EL from the illumination optical system IL so that the pattern of the mask M is projected onto the substrate P through the projection optical system PL and the liquid 50. Simultaneously, the control unit CONT projects the detecting light beam onto the substrate P from the projecting system 21 in the inclined direction. The control unit CONT performs the exposure process for the substrate P while detecting the position of the surface of the substrate P in the Z axis direction (Step S2).

The detecting light beam, which is projected from the projecting system 21 onto the substrate P, passes through the liquid 50 which fills the space 56, and the detecting light beam is projected onto the projection area on the substrate P. In this situation, when the bubble 18 is present (adhered) on the surface of the substrate P in the projection area as shown in FIG. 4, the detecting light beam, which is projected onto the bubble 18, is scattered. When a part of the detecting light beam projected onto the bubble 18 is scattered, then strong light beams, which are not detected in ordinary cases, come into the light-receivers 22B, 22C, and the light intensity, which is to be received by the light-receiver 22A corresponding to the detecting light beam, is lowered. Results of the detection performed by the light-receivers 22A, 22B, 22C are outputted to the control unit CONT. The control unit CONT detects whether or not the bubble is present on the substrate P on the basis of the light intensities detected by the light-receiving system 22 (Step S3).

In this embodiment, the control unit CONT can determine the size and the amount of the bubble 18 on the basis of the light intensities detected by the light-receivers 22B, 22C. For example, the light is scattered at a larger angle by a small bubble. Therefore, the control unit CONT can determine the size of the bubble 18 by determining the direction of the scattered light from the bubble 18 on the basis of the results of the detection of the light-receivers 22B, 22C. Further, the amount of the bubble 18 per unit area on the substrate P can be also determined by detecting the intensity of the received light.

In this procedure, the position of the substrate P in the XY directions is specified by the result of measurement performed by the laser interferometer 55. Further, the position of installation in the Y axis direction of the light-receivers 22A which has received the detecting light beam projected onto the bubble 18 is also specified on the basis of the designed value. Therefore, the control unit CONT can specify the position at which the bubble 18 is present on the substrate P, on the basis of the result of measurement of the laser interferometer 55 and the information about the position of installation of the light-receiver 22A for which the light intensity of the received light is lowered. When the position at which the bubble 18 is present is specified, the control unit CONT stores the position information about the bubble 18 in the memory unit MRY (Step S4).

The control unit CONT projects the detecting light beam onto the substrate P while scanning the substrate P in the X axis direction. Accordingly, it is possible to detect the information about the bubble 18 for each of the shot areas including, for example, the presence or absence of the bubble 18 and the amount of the bubble.

In this arrangement, the memory unit MRY stores the threshold value information about the bubble 18 to determine whether or not the pattern is transferred at a desired pattern transfer accuracy with respect to the substrate P. The threshold value includes a threshold value in relation to the size of the bubble 18, and a threshold value in relation to the amount (number) of the bubble or bubbles for one shot area. The threshold value information stored in the memory unit MRY is compared with the result of the bubble detection performed by the bubble detector 20 (Step S5).

Subsequently, the control unit CONT judges whether or not the result of the bubble detection performed by the bubble detector 20 is not less than the threshold value (Step S6).

For example, when a slight amount of the bubble 18 having a small diameter floats in the liquid 50, the desired pattern transfer accuracy is obtained in some cases even when the bubble 18 exists in the liquid. Accordingly, the threshold value in relation to the amount and the size of the bubble 18 is determined beforehand. If the result of the bubble detection is not more than the threshold value, it is judged that the exposure for the substrate P can be performed appropriately. That is, the control unit CONT refers to the threshold value information about the bubble stored in the memory unit MRY to judge whether or not the exposure for the substrate P has been performed appropriately, on the basis of the result of the detection performed by the bubble detector 20. The threshold value is previously determined, for example, experimentally, and the threshold value is stored in the memory unit MRY beforehand.

If it is judged that the bubble 18 is not more than the threshold value, i.e., if it is judged that the exposure for the substrate P is performed appropriately, then the control unit CONT continues the exposure process. On the other hand, if it is judged that the bubble 18 is not less than the threshold value, i.e., if it is judged that the exposure for the substrate P is not performed appropriately due to the presence of the bubble 18, then the control unit CONT performs, for example, the following process. That is, the control unit CONT interrupts the exposure process operation, and/or the control unit CONT drives the display unit DS and/or an unillustrated alarm unit to notice that the bubble of not less than the allowable range (not less than the threshold value) exists. In some cases, the position information about the bubble 18 on the substrate P is displayed on the display unit DS (Step S7).

Figure 6:
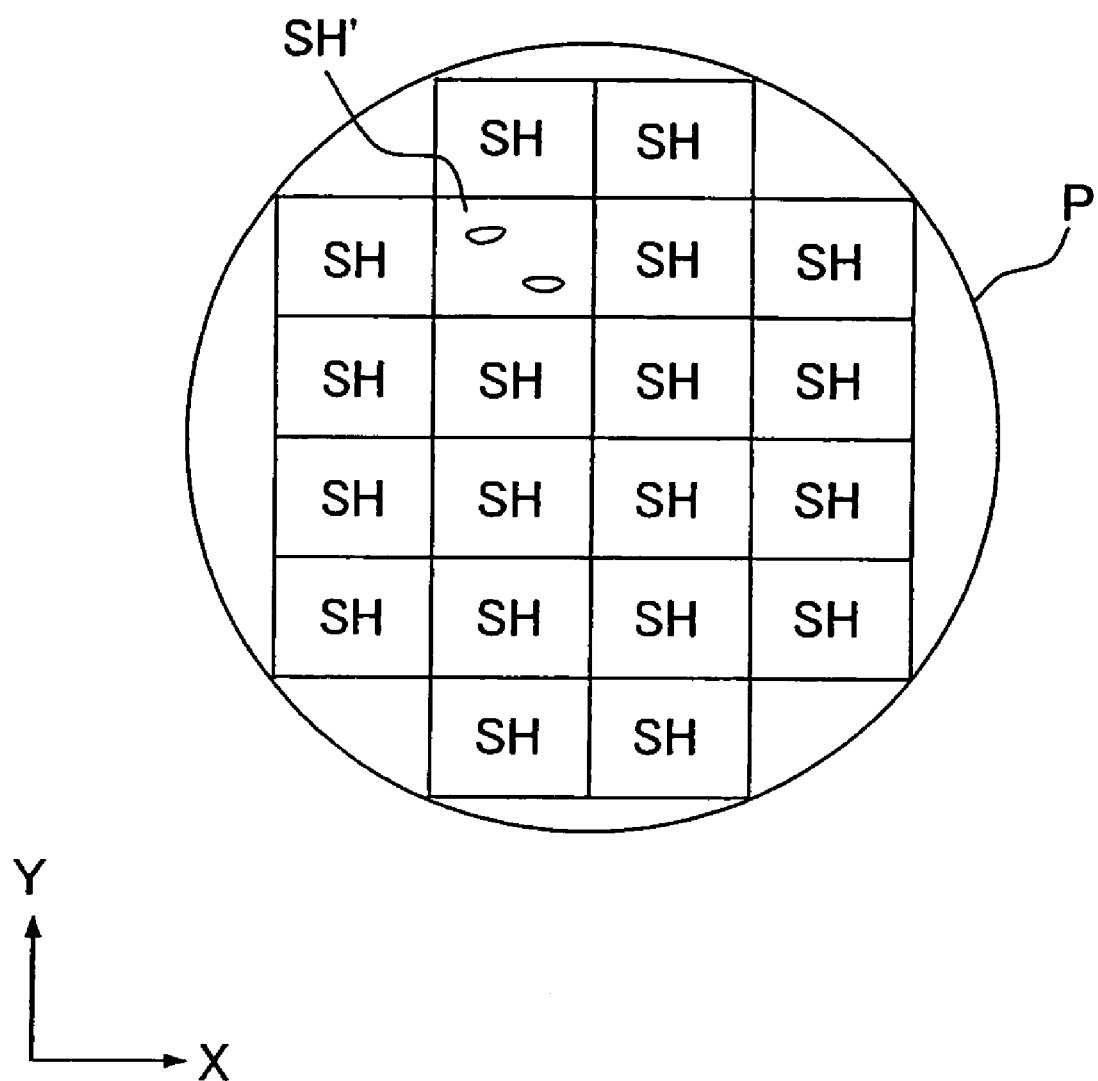
FIG. 6 shows a plan view illustrating shot areas on a substrate.

A consideration will now be made about a case in which the plurality of shot areas SH on the substrate P are subjected to the exposure respectively as shown in FIG. 6. In this case, even if it is judged in Step S6 that the bubble 18 is not less than the threshold value, the control unit CONT continues the exposure process. In this procedure, the control unit CONT detects the bubble 18 by using the bubble detector 20 during the exposure for each of the plurality of shot areas SH on the substrate P. The control unit CONT refers to the threshold value information and the position information about the bubble obtained by the laser interferometer to store, in the memory unit MRY, the shot area SH' which is included in the plurality of shot areas SH and in which the image formation of the pattern image is not performed appropriately due to the bubble 18 (Step S8). After the completion of the exposure process, the following procedure can be adopted on the basis of the information stored in the memory unit MRY. That is, the exposure process is not performed for another layer thereafter, and/or the resist is applied again to perform the exposure again for the shot area SH' which is included in the plurality of shot areas SH and in which the image formation of the pattern image has not been performed appropriately.

In this embodiment, the plurality of detecting light beams include the detecting light beam L1 which is projected onto the projection area PA on the substrate P and the detecting light beam Le which is projected onto the boundary portions on the both sides in the Y axis direction. It is possible to judge whether or not the space 56 is filled with the liquid 50, on the basis of the results of the receiving of the detecting light beams L1, Le by the light-receiving system 22. For example, if a situation arises, in which a part of the space 56 does not retain the liquid 50 due to any inconvenience such as the exfoliation of the liquid 50 in the vicinity of the boundary portion of the projection area PA on the substrate P, then the optical path of the detecting light beam Le is changed, and the light beam Le is not received by the light-receiving system 22 to give a state of absence of incidence in which the light beam Le does not come into the receiving system 22. The control unit CONT can judge the fact that the space 56 is not filled with the liquid 50, on the basis of the result of the receiving of the detecting light beam Le by the light-receiver 22A. On the other hand, for example, it is also conceived that the liquid supply unit 1 malfunctions due to any cause, and the liquid 50 is insufficient between the projection optical system PL and the substrate P. Also in this case, the optical path of the detecting light beam L1 is changed to give a state of absence of incidence in which the light beam L1 does not come into the light-receiver 22A. The control unit CONT can detect the fact that the liquid in the space 56 is insufficient, on the basis of the result of the receiving by the light-receiver 22A. As described above, the bubble detector 20 also functions as a liquid shortage-detecting unit for detecting the shortage of the liquid 50 between the projection optical system PL and the substrate P. In this specification, the phrase "liquid is insufficient or in shortage" includes not only the case in which the liquid is not supplied to the space 56 partially or insufficiently in amount but also the case in which the liquid does not exist at all.

Also in this case, the control unit CONT detects the liquid insufficiency or discontinuity (liquid shortage) by using the liquid shortage detector 20 during the exposure for each of the plurality of shot areas SH on the substrate P. The shot area (defective shot area) SH', which is included in the plurality of shot areas SH and in which the liquid shortage arises during the exposure, is stored in the memory unit MRY on the basis of the result of the measurement of the position performed by the laser interferometer. After the completion of the exposure process, the following procedure is adopted on the basis of the information stored in the memory unit MRY. That is, the exposure process is not performed for another layer thereafter, and/or the resist is applied again to perform the exposure again for the shot area SH' which is included in the plurality of shot areas SH and in which the image formation of the pattern image has not been performed appropriately due to the liquid shortage.

The liquid shortage detector described above is constructed such that the liquid shortage detector optically detects whether or not the liquid shortage arises. However, for example, a liquid shortage detector may be constructed by a flow rate meter (flow rate-detecting unit) provided for the supply nozzle 4 or the supply tube 3 of the liquid supply unit 1. The flow rate-detecting unit detects the flow rate of the liquid per unit time for the liquid 50 to be supplied to the space 56, and the result of the detection is outputted to the control unit CONT. The control unit CONT judges that the liquid shortage occurs if the flow rate of the liquid is not more than a predetermined value, on the basis of the result of the detection performed by the flow rate-detecting unit.

The following situations are also conceived. That is, not only the small gas portion such as the bubble but also a relatively large gas space (gas portion) appears in the liquid in some cases. In other cases, the gas remains on the side of the image plane of the projection optical system PL when the supply of the liquid from the liquid supply unit 1 is started. In such situations, a state of absence of incidence is also given, in which the detecting light beam L1 does not come into the light-receiver 22A. Therefore, it is possible to detect the presence or absence of the gas portion on the side of the image plane of the projection optical system PL on the basis of the result of the receiving by the light-receiver 22A. As described above, the bubble detector 20 not only detects the bubble in the liquid but also functions to detect the presence or absence of the gas portion between the projection optical system PL and the substrate P.

As explained above, it is possible to detect the information about the bubble 18 which greatly affects the pattern transfer accuracy in the space 56 by providing the bubble detector 20 which detects the bubble 18 in the liquid 50 that fills the space 56 between the projection optical system PL and the substrate P. Accordingly, it is possible to apply an appropriate treatment in order to maintain the good productivity. When the bubble exists in the liquid, it is judged whether or not the pattern is transferred appropriately on the basis of the result of the detection of the bubble. Accordingly, for example, it is possible to adopt, as a product, only a device or devices corresponding to the shot area to which the pattern has been transferred appropriately. Further, it is possible to perform a treatment in order to remove the bubble after the exposure process is once interrupted.

This embodiment has been explained as exemplified by the case in which the bubble 18 adhered to the surface of the substrate P is detected. However, even when the bubble floats in the liquid 50, the intensity of the light received by the light-receiving system 22 is changed by radiating the detecting light beam onto the floating bubble. Therefore, it is also possible to detect the amount of the bubble floating in the liquid 50. Further, the intensity of the light received by each of the light-receivers 22B, 22C differs between the detecting light beam with which the floating bubble is detected and the detecting light beam with which the bubble adhered to the substrate P is detected. Therefore, it is also possible to judge whether the detected bubble is the floating bubble or the bubble adhered to the substrate P, on the basis of the result of the receiving by each of the light-receivers 22B, 22C. Further, when the detecting light beam is radiated onto the lower surface 7 of the projection optical system PL, it is also possible to detect the information about the bubble adhered to the lower surface 7 of the projection optical system PL. A part of the detecting light beam from the projecting system 21 may be used to detect the surface position of the substrate P.

In this embodiment, the projecting system 21 projects the detecting light beam in parallel to the XZ plane onto the substrate P from the separated position in the scanning direction of the substrate P, and thus it is intended to improve the detection accuracy. However, another arrangement is also available, in which the detecting light beam is projected in parallel to the YZ plane onto the substrate P. In this embodiment, the plurality of spot light beams (detecting light beams), which are aligned in the Y axis direction, are radiated onto the substrate P. However, for example, the following procedure is also available. That is, one spot light beam is subjected to the scanning in the Y axis direction, while the substrate P is scanned in the X axis direction across the spot light beam. Alternatively, a spot light beam, which extends in the Y axis direction, may be projected onto the substrate P. Even in the case of the arrangement as described above, it is possible to perform the operation for detecting the bubble for a predetermined area of the surface of the substrate P.

The embodiment described above has been explained as exemplified by the case in which the liquid immersion area is formed on the substrate P. However, it is also conceived that the side of the image plane of the projection optical system PL is filled with the liquid even when various measuring members and sensors are used on the substrate stage PST (Z stage 51). If it is feared that any measurement error is brought about if any gas portion (bubble or the like in the liquid) is present on the side of the image plane of the projection optical system PL when the measurement is performed through the liquid by using the measuring member and/or the sensor as described above, then it is also appropriate to detect, for example, the presence or absence of the gas portion by using the bubble detector 20. Specified contents of the various measuring members and the sensors capable of being used on the substrate stage PST (Z stage 51) are described in detail, for example, in Japanese Patent Application Laid-open Nos. 2002-14005, 11-16816, 57-117238, 11-238680, 2000-97916, and 4-324923, contents of which are incorporated herein by reference respectively within a range of permission of the domestic laws and ordinances of the state designated or selected in this international application.

Next, an explanation will be made with reference to FIG. 8 about another embodiment of the present invention. In the following description, constitutive parts, which are the same as or equivalent to those of the embodiment described above, are designated by the same reference numerals, any explanation of which will be simplified or omitted.

FIG. 8 shows a side view illustrating those disposed in the vicinity of the tip section of the projection optical system PL. With reference to FIG. 8, the space between the substrate P and the optical element 60 at the tip section of the projection optical system PL is filled with the liquid 50, and the liquid immersion area AR filled with the liquid 50 is formed on the substrate P. In FIG. 8, the supply nozzles 4 for supplying the liquid 50 onto the substrate P and the recovery nozzles 5 for recovering the liquid 50 from the substrate P are omitted from the illustration.

The following explanation of this embodiment will be made about a case in which the substrate P is opposed to the optical element 60 of the projection optical system PL. However, the present invention is also equivalently applicable to a case in which various measuring members and sensors on the substrate stage PST (Z stage 51) are opposed to the optical element 60 of the projection optical system PL as disclosed, for example, in Japanese Patent Application Laid-open Nos. 2002-14005, 11-16816, 57-117238, 11-238680, 2000-97916, and 4-324923.

The exposure apparatus EX is provided with a focus-detecting system 70 which detects the surface position information about the substrate P. The focus-detecting system 70 includes a projecting system 71 and a light-receiving system 72 which are provided on the both sides of the projection optical system PL respectively while interposing the projection area PA of the projection optical system PL therebetween. A detecting light beam La is projected in an oblique direction from the projecting system 71 through the liquid 50 on the substrate P onto the surface (exposure surface) of the substrate P. The detecting light beam (reflected light beam), which is reflected by the substrate P, is received by the light-receiving system 72. The control unit CONT controls the operation of the focus-detecting system 70. Further, the control unit CONT detects the position (focus position) and the inclination of the surface of the substrate P in the Z axis direction with respect to a predetermined reference plane on the basis of the result of the receiving by the light-receiving system 72. In FIG. 8, the projecting system 71 and the light-receiving system 72 are provided at the positions separated from the projection area PA on the respective sides in the ±X directions while interposing the projection area PA therebetween. However, the projecting system 71 and the light-receiving system 72 may be provided on the respective sides in the ±Y directions while interposing the projection area PA therebetween.

Figure 9:
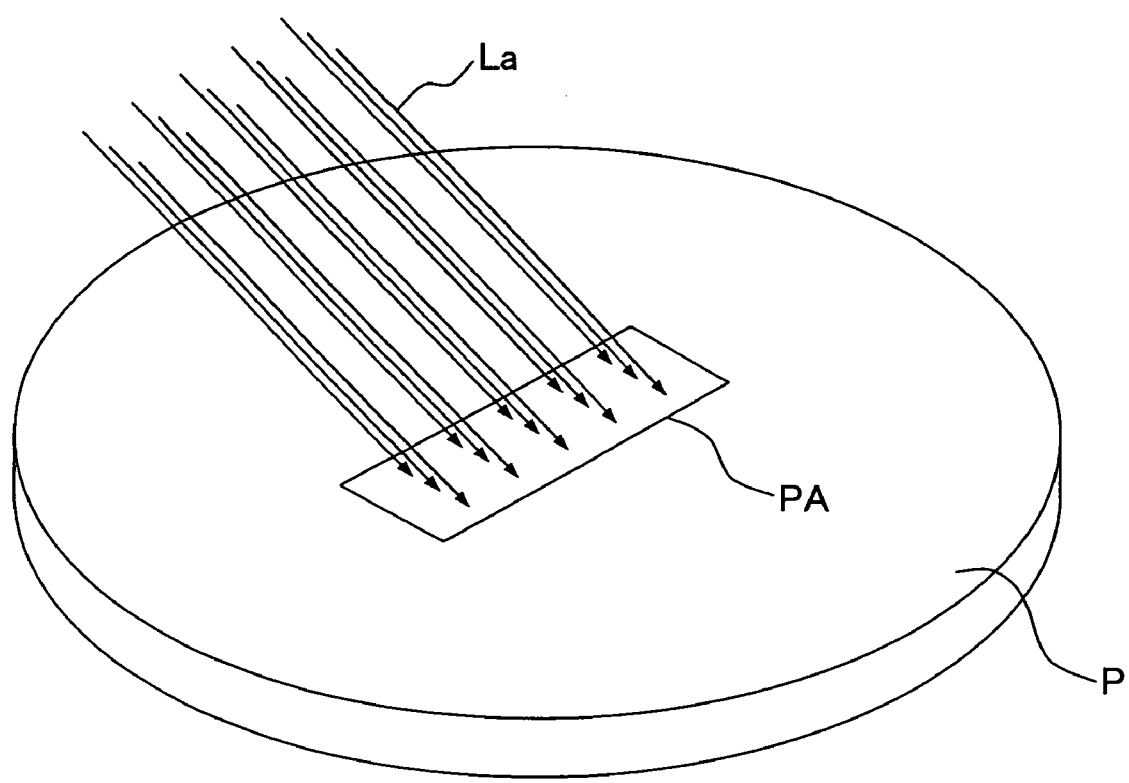
FIG. 9 shows a schematic view illustrating the gas-detecting system according to the present invention.

The projecting system 71 of the focus-detecting system 70 has a plurality of projectors. As shown in FIG. 9, the projecting system 71 projects a plurality of detecting light beams La onto the substrate P. The light-receiving system 72 has a plurality of light-receivers corresponding to the plurality of projectors. Accordingly, the focus-detecting system 70 can determine respective focus positions, for example, at a plurality of points (respective positions) in a matrix form respectively on the surface of the substrate P. Further, the focus-detecting system 70 can determine the posture of the substrate P in the inclined direction on the basis of the focus positions determined at the plurality of points respectively. The arrangement of the focus-detecting system 70 is described in detail, for example, in Japanese Patent Application Laid-open No. 8-37149, a content of which is incorporated herein by reference within a range of permission of the domestic laws and ordinances of the state designated or selected in this international application.

The control unit CONT drives the Z stage 51 (see FIG. 1) of the substrate stage PST by the aid of the substrate stage-driving unit PSTD on the basis of the result of the detection performed by the focus-detecting system 70. Accordingly, the control unit CONT controls the position (focus position) in the Z axis direction and the positions in the θX, θY directions of the substrate P retained by the Z stage 51. That is, the Z stage 51 is operated on the basis of the instruction from the control unit CONT based on the result of the detection performed by the focus-detecting system 70 to control the focus position (Z position) and the angle of inclination of the substrate P so that the surface (exposure surface) of the substrate P is adjusted to match the image plane formed via the projection optical system PL and the liquid 50.

With reference to FIG. 8 again, a first optical member 81 through which the detecting light beam La radiated from the projecting system 71 of the focus-detecting system 70 is transmissive, and a second optical member 82 through which the detecting light beam La reflected by the substrate P is transmissive are provided in the vicinity of the tip section of the projection optical system PL. The first optical member 81 and the second optical member 82 are supported in a state of being separated from the optical element 60 disposed at the tip of the projection optical system PL. The first optical member 81 is arranged on the side in the −X direction of the optical element 60, and the second optical member 82 is arranged on the side in the +X direction of the optical element 60. The first optical member 81 and the second optical member 82 are provided at the positions at which the optical path of the exposure light beam EL and the movement of the substrate P are not disturbed and at which the first and second optical members 81, 82 are capable of making contact with the liquid 50 of the liquid immersion area AR.

As shown in FIG. 8, the liquid 50 is supplied onto the substrate P from the liquid supply unit 1 (see FIG. 1) so that the optical path for the exposure light beam EL having passed through the projection optical system PL, i.e., the optical path for the exposure light beam EL, which is disposed between the optical element 60 and the substrate P (projection area PA on the substrate P), is entirely filled with the liquid 50 during the exposure process for the substrate P. When a predetermined state is established, in which the optical path for the exposure light beam EL between the optical element 60 and the substrate P is entirely filled with the liquid 50, and the liquid immersion area AR covers all of the projection area PA on the substrate P, then the liquid 50, which forms the liquid immersion area AR, makes tight contact (contact) with the respective end surfaces of the first optical member 81 and the second optical member 82. In the state in which the liquid immersion area AR is formed on the substrate P, and the liquid 50 makes tight contact with the respective end surfaces of the first optical member 81 and the second optical member 82, all of the optical paths between the first optical member 81 and the second optical member 82, which are included in the optical paths for the reflected light beam La on the substrate P and the detecting light beam La projected from the projecting system 71 of the focus-detecting system 70, are filled with the liquid 50. In the state in which the optical path for the detecting light beam La is entirely filled with the liquid 50, the detecting light beam La, which is emitted from the projecting system 71 of the focus-detecting system 70, is established such that the detecting light beam La is radiated onto the projection area PA of the projection optical system PL on the substrate P. It is also allowable to provide the detecting light beam which is radiated onto areas disposed outside the projection area PA, especially onto the position separated in the scanning direction (X axis direction) of the substrate P with respect to the projection area PA.

In the state in which the liquid immersion AR is formed under the predetermined condition, and all of the optical paths for the detecting light beams La between the first optical member 81 and the second optical member 82 are filled with the liquid 50, the detecting light beam La, which is projected from the projecting system 71 of the focus-detecting system 70, passes through the first optical member 81 and the liquid 50 of the liquid immersion area AR, and the detecting light beam La is radiated in a desired state onto the substrate P (projection area PA) without causing, for example, the scattering and the refraction. The reflected light beam La, which comes from the substrate P, passes through the liquid 50 of the liquid immersion area AR and the second optical member 82, and it is received in a desired state by the light-receiving system 72. In other words, when the detecting light beam La, which is projected from the projecting system 71 of the focus-detecting system 70, is received by the light-receiving system 72, the liquid immersion area AR is formed in a predetermined state. As described above, it is possible to optically detect whether or not the optical path for the detecting light beam La is entirely filled with the liquid 50, on the basis of the output of the light-receiving system 72 of the focus-detecting system 70.

As described above, when the liquid immersion area AR is formed in the predetermined state, then the detecting light beam La, which is projected from the projecting system 71 of the focus-detecting system 70, is radiated onto the projection area PA of the projection optical system PL, and the detecting light beam La passes through at least a part of the optical path for the exposure light beam EL including the projection area PA. Accordingly, the focus-detecting system 70 can optically detect whether or not the optical path for the exposure light beam EL is filled with the liquid 50, on the basis of the output of the light-receiving system 72.

In this embodiment, the first optical member 81 and the second optical member 82 have been explained as mutually independent members. However, for example, the first optical member 81 and the second optical member 82 may be constructed as a single annular optical member to surround the optical element 60 at the tip section of the projection optical system PL. The detecting light beam can be radiated onto a part of the annular optical member, and the detecting light beam, which has passed along a liquid immersion area AR2 and the surface of the substrate P, can be received through the annular optical member. When the optical member is formed to be annular so that the liquid 50 of the liquid immersion area AR is allowed to make tight contact with the inner side surface of the annular optical member, it is possible to satisfactorily maintain the shape of the liquid immersion area AR2. In this embodiment, the first optical member 81 and the second optical member 82 are provided separately with respect to the projection optical system PL. However, the first optical member 81 and the second optical member 82 may be provided integrally with the optical element 60 of the projection optical system PL.

When the liquid contact surfaces as the end surfaces of the first and second optical members 81, 82 or the liquid contact surface of the annular optical member is made lyophilic or liquid-affinitive by performing, for example, a lyophilic treatment, the liquid 50 of the liquid immersion area AR easily makes tight contact with the liquid contact surfaces of the optical members. Therefore, it is easy to maintain the shape of the liquid immersion area AR.

Figure 10:
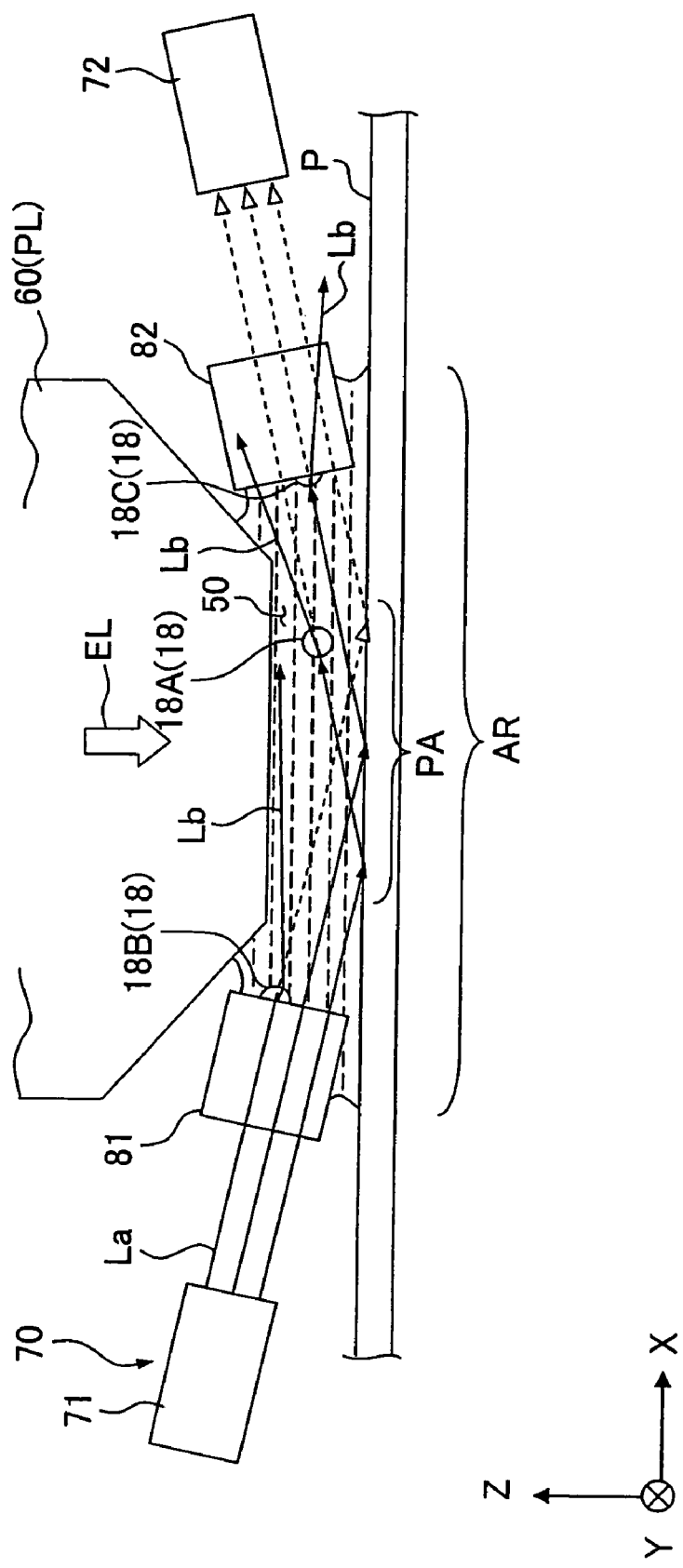
FIG. 10 shows an operation for detecting a gas portion, performed by the gas-detecting system according to the present invention.

FIG. 10 shows a state in which a bubble 18 exists in the liquid 50 in the liquid immersion area AR. As shown in FIG. 10, the detecting light beam La, which collides with the bubble 18 and which is included in the plurality of detecting light beams La projected from the projecting system 71 of the focus-detecting system 70, causes, for example, the scattering and the refraction. Therefore, the detecting light beam La, which collides with the bubble 18, is received by the light-receiving system 72 in a state in which the light amount is lowered, or the detecting light beam La is not received by the light-receiving system 72, because its optical path is changed. In other words, when the bubble (gas portion) 18 is present in the liquid 50, the intensity of the light received by the light-receiving system 72 is changed (lowered). Therefore, the focus-detecting system 70 can optically detect the bubble (gas portion) 18 existing in the liquid 50 of the liquid immersion area AR formed on the optical path for the exposure light beam EL, on the basis of the output of the light-receiving system 72. The liquid immersion area AR is formed on the optical path for the exposure light beam EL, and the detecting light beam La irradiates the projection area PA as a part of the optical path for the exposure light beam EL. Therefore, the focus-detecting system 70 can detect the presence or absence of the bubble (gas portion) in the optical path for the exposure light beam EL, i.e., whether or not the optical path for the exposure light beam EL is filled with the liquid 50, on the basis of the output of the light-receiving system 72. Further, the focus-detecting system 70 can detect the bubble (gas portion) in the optical path for the detecting light beam La in the liquid 50.

As shown in FIG. 10, the bubble 18 herein includes a bubble 18A which floats in the liquid 50, a bubble 18B which adheres to the end surface (liquid contact surface) of the first optical member 81, a bubble 18C which adheres to the end surface (liquid contact surface) of the second optical member 82, and a bubble (not shown) which adheres on the substrate P. When the bubble 18 is present in the liquid 50 of the liquid immersion area AR, the detecting light beam La, which is projected from the projecting system 71 of the focus-detecting system 70, causes, for example, the scattering and the refraction. The light amount (amount of received light) is changed with respect to the light-receiving system 72, or the optical path is changed and thus the detecting light beam La is not received by the light-receiving system 72 (see the symbol Lb). Therefore, the focus-detecting system 70 can detect the presence or absence of the gas portion (bubble) in the liquid 50 of the liquid immersion area AR provided on the optical path for the exposure light beam EL, on the basis of the output of the light-receiving system 72.

This embodiment is constructed such that the focus-detecting system 70 detects the bubble 18 in the optical path for the detecting light beam La on the basis of the output of the light-receiving system 72. Therefore, it is possible to detect not only the bubble adhered on the substrate P and the bubble 18 (18B, 18C) adhered to each of the first and second optical members 81, 82 but also the bubble 18 (18A) floating in the liquid 50 for forming the liquid immersion area AR. Therefore, it is also possible to detect the bubble 18 which exists at any position other than those in the optical path for the exposure light beam EL in the liquid 50 of the liquid immersion area AR provided that the bubble 18 exists on the optical path for the detecting light beam La. The control unit CONT performs the exposure process while detecting the surface position information about the substrate P by using the focus-detecting system 70. The focus-detecting system 70 can project the detecting light beam La during the exposure process for the substrate P to detect the presence or absence of the gas portion in the liquid 50 on the optical path for the exposure light beam EL and the presence or absence of the gas portion in the optical path for the detecting light beam La. Of course, the focus-detecting system 70 can also detect the presence or absence of the gas portion in the liquid 50 of the liquid immersion area AR at any timing other than those during the exposure process.

The focus-detecting system 70 can also detect the bubble 18 existing at any position other than those in the optical path for the exposure light beam EL in the liquid 50 of the liquid immersion area AR provided that the bubble 18 exists on the optical path for the detecting light beam La. For example, even when the bubble 18, which exists at any position other than those in the optical path for the exposure light beam EL, is moved in the liquid 50 in accordance with the movement of the substrate P during the scanning exposure, and the bubble 18 is arranged on the optical path for the exposure light beam EL, or the bubble 18 adheres to the substrate P or the optical element 60, then the focus-detecting system 70 can be used to detect the bubble 18 before the bubble 18, which exists at any position other than those in the optical path for the exposure light beam EL, is arranged on the optical path for the exposure light beam EL, or before the bubble 18 adheres to the substrate P or the optical element 60. Therefore, it is possible to predict that the bubble 18, which previously floated in the liquid 50, may be arranged on the substrate P or on the optical path for the exposure light beam EL, on the basis of the output of the focus-detecting system 70 to perform an appropriate process including, for example, the stop of the exposure process and th driving of the alarm unit, for example, before the bubble 18, which previously floated in the liquid 50, is arranged on the substrate P or on the optical path for the exposure light beam EL during the exposure process. Accordingly, it is possible to avoid the inconvenience of the occurrence of the exposure failure and the defective shot.

The projecting system 71 of the focus-detecting system 70 radiates the plurality of detecting light beams La onto the respective points in the matrix form on the substrate P. Therefore, the focus-detecting system 70 can detect the position information about the bubble 18 on the basis of the respective light intensities (received light amounts) of the plurality of detecting light beams La received by the light-receiving system 72. In this embodiment, the information about the respective radiation positions of the plurality of detecting light beams La are specified on the basis of the designed values. The control unit CONT can specify the position of the bubble 18 (optical path for the detecting light beam in which the bubble 18 exits) on the basis of the information about the radiation position of the detecting light beam La which has a lowered intensity of the light beam to come into each of the light-receivers of the light-receiving system 72, or the information about the position of installation of each of the light-receivers of the light-receiving system 72 corresponding to the detecting light beam La.

Figure 11:
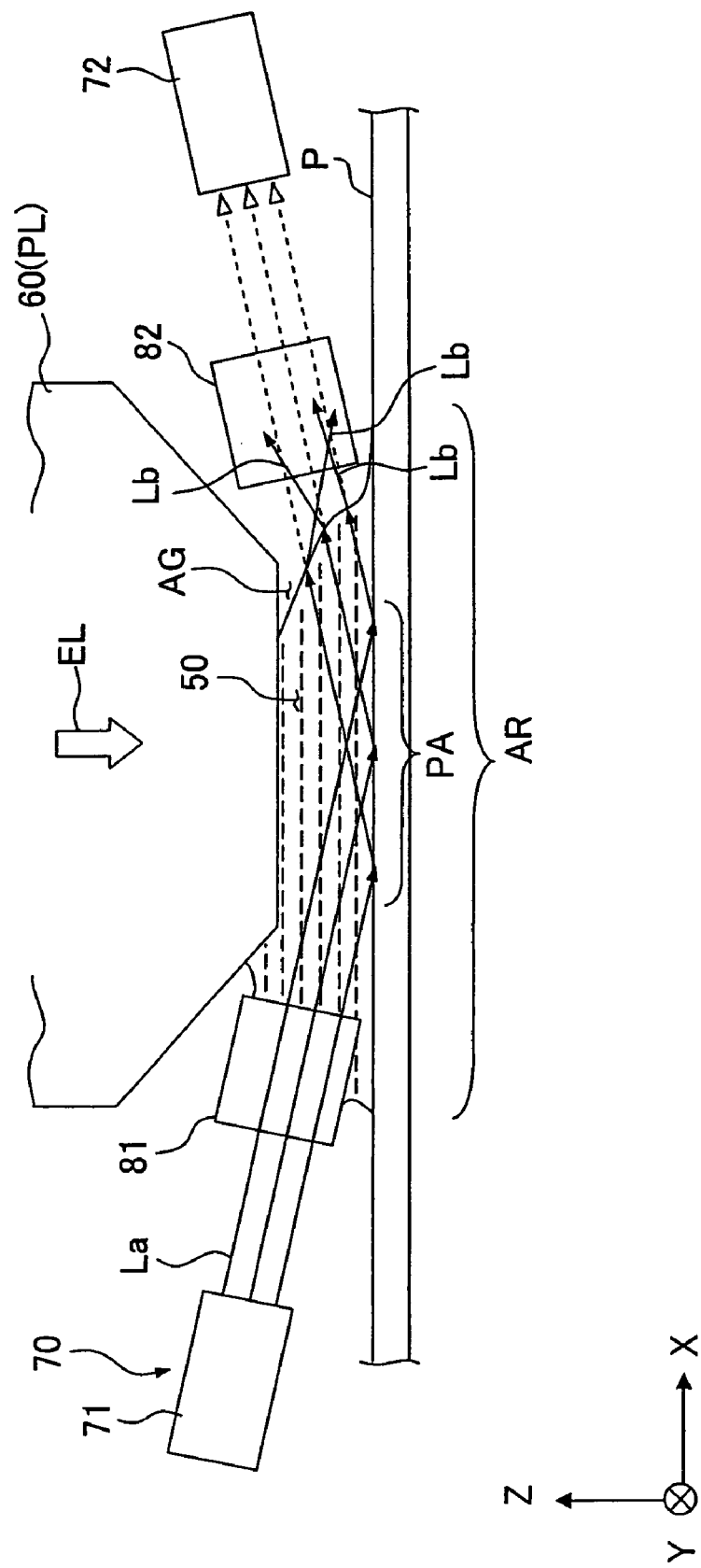
FIG. 11 shows an operation for detecting a gas portion, performed by the gas-detecting system according to the present invention.

As shown in FIG. 11, there may be a possibility as follows. That is, the space between the substrate P and the optical element 60 of the projection optical system PL is not sufficiently filled with the liquid 50, and a part of the liquid 50 is discontinued or interrupted. The liquid immersion area AR is not formed in a predetermined state, and a gas area AG is formed in the optical path for the exposure light beam EL. The focus-detecting system 70 can also detect the presence or absence of the gas area AG. The gas area AG is generated, for example, by the exfoliation of the liquid 50 caused by the movement of the substrate P and/or the malfunction of the liquid supply unit 1. In FIG. 11, the gas area AG is formed in the vicinity of the second optical member 82. The liquid 50 in the liquid immersion area AR does not make tight contact (contact) with the end surface of the second optical member 82. Also in this case, the detecting light beam La, which is emitted from the projecting system 71 of the focus-detecting system 70, causes, for example, the scattering and the refraction at the interface between the gas area AG and the liquid 50 of the liquid immersion area AR. The detecting light beam La is received by the light-receiving system 72 in a state in which the light amount is lowered, or the detecting light beam La is not received by the light-receiving system 72. The focus-detecting system 70 can detect, based on the output of the light-receiving system 22, the presence or absence of the gas area AG in the optical path for the exposure light beam EL in the liquid immersion area AR, i.e., whether or not the optical path for the exposure light beam EL is filled with the liquid 50. Also in this case, the control unit CONT performs the exposure process while detecting the surface position information about the substrate P by using the focus-detecting system 70. Therefore, it is possible to detect the presence or absence of the gas portion in the optical path for the exposure light beam EL during the exposure for the substrate P and/or the presence or absence of the gas portion in the optical path for the detecting light beam La, on the basis of the output of the focus-detecting system 70 (light-receiving system 72). When the gas area AG is detected by the focus-detecting system 70 during the exposure process, the control unit CONT can apply an appropriate process on the basis of the output of the focus-detecting system 70, for example, such that the exposure operation is stopped, or the amount of the liquid to be supplied by the liquid supply unit 1 and/or the amount of the liquid to be recovered by the liquid recovery unit 2 is adjusted to maintain the liquid immersion area AR to be in a predetermined state.

Figure 12A:
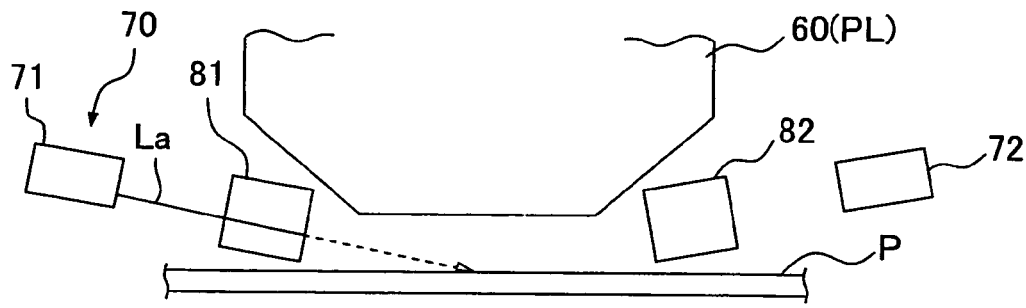
FIGS. 12A to 12C show an operation for detecting a gas portion, performed by the gas-detecting system according to the present invention.
Figure 12B:
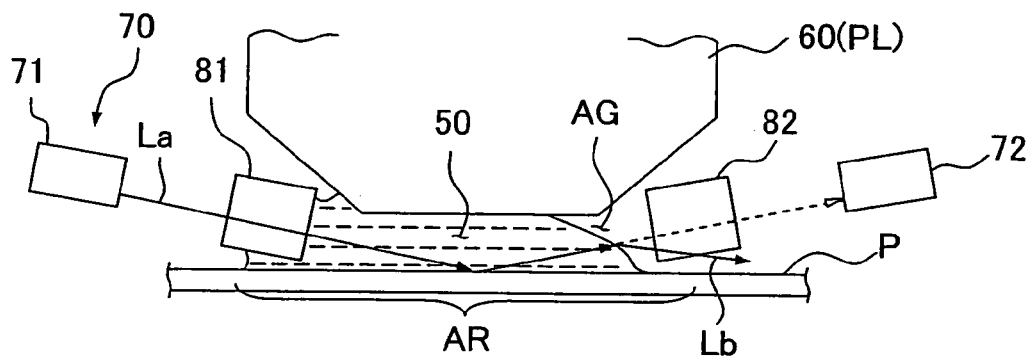
Figure 12C:
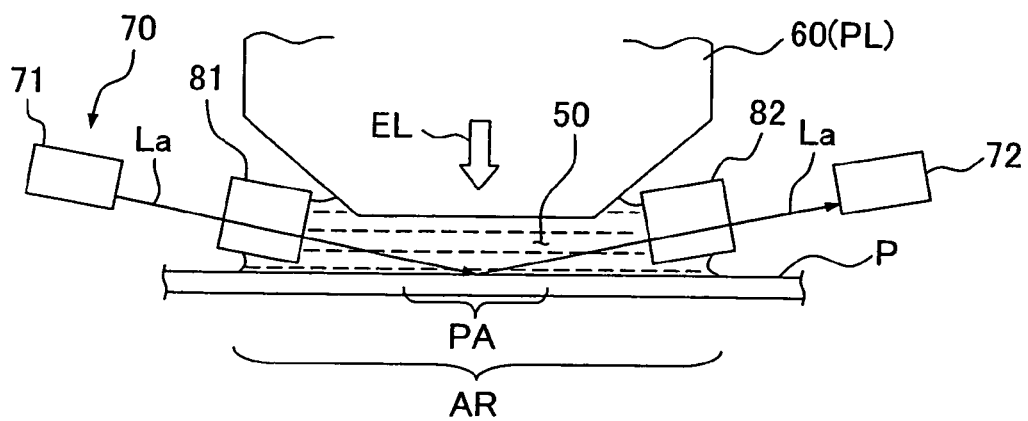

When the substrate P is subjected to the liquid immersion exposure process, as shown in FIG. 12A, the liquid immersion area-forming operation is performed to form the liquid immersion area AR on the substrate P by driving the liquid supply unit 1 and the liquid recovery unit 2 before starting the exposure process after loading the substrate P to the substrate stage PST. In this procedure, the control unit CONT performs the liquid immersion area-forming operation before the exposure process while radiating the detecting light beam La, from the projecting system 71 of the focus-detecting system 70, onto the substrate P. Accordingly, it is possible to judge whether or not the start of the exposure for the substrate P is appropriate, on the basis of the output of the focus-detecting system 70 (light-receiving system 72). That is, when the gas area AG is present while the liquid immersion area AR has not been formed sufficiently yet as shown in FIG. 12B in the operation for forming the liquid immersion area before the exposure process, the light intensity of the detecting light beam La to arrive at the light-receiving system 72 is lowered. The control unit CONT judges that the liquid immersion area AR is not sufficiently formed yet, on the basis of the output of the light-receiving system 72 of the focus-detecting system 70. The control unit CONT judges that the start of the liquid immersion exposure process is inappropriate. The control unit CONT continues the liquid immersion area-forming operation until the liquid immersion area AR is formed to be in a predetermined state. In some cases, the control unit CONT changes the operation condition concerning the formation of the liquid immersion area, for example, such that the supply amount of the liquid to be supplied by the liquid supply unit 1 and/or the recovery amount of the liquid to be recovered by the liquid recovery unit 2 is changed, and the position of the substrate P is moved. As shown in FIG. 12C, when the liquid immersion area AR is sufficiently formed, and the optical path for the detecting light beam La between the first optical member 81 and the second optical member 82 is filled with the liquid 50, then the optical path for the exposure light beam EL between the substrate P and the optical element 60 of the projection optical system PL is also filled with the liquid 50. In this state, the detecting light beam La, which is projected from the projecting system 71, comes into the light-receiving system 72 at a predetermined light intensity. Therefore, the control unit CONT judges that the liquid immersion area AR is formed, and the control unit CONT judges that the start of the liquid immersion exposure process is appropriate, on the basis of the output of the light-receiving system 72 of the focus-detecting system 70. Subsequently, the control unit CONT starts the radiation of the exposure light beam EL to perform the exposure process.

When the gas portion such as the bubble 18 and the gas area AG is detected in the liquid immersion area AR including the optical path for the exposure light beam EL by the focus-detecting system 70 during the exposure for the substrate P as described above, the control unit CONT performs the process, for example, such that the exposure process for the substrate P is stopped. However, it is conceived that the following situation may appear. That is, the detecting light beam La is not received at a predetermined light intensity by the light-receiving system 72, although the optical path for the exposure light beam EL is filled with the liquid 50. In such a situation, an inconvenience arises such that the exposure process is stopped although the liquid immersion exposure process can be performed. For example, as shown in FIG. 13, a detecting light beam La3, which is included in a plurality of detecting light beams La1 to La5 projected from the projecting system 71 of the focus-detecting system 70 and which is radiated onto a gap 58 between an edge section E of the substrate P and a plate member 57 provided around the substrate P, has such a possibility that the detecting light beam La3 is not received at a predetermined light intensity by the light-receiving system 72 due to the occurrence of, for example, the scattering and the refraction. In this case, the plate member 57 is an annular member which is provided concentrically around the substrate P. The upper surface of the plate member 57 has approximately the same height as that of the upper surface of the substrate P. The plate member 57 makes it possible to maintain the shape of the liquid immersion area AR by retaining the liquid 50 under the optical element 60 of the projection optical system PL even when the liquid immersion exposure is performed for areas or portions disposed in the vicinity of the edge section E of the substrate P. The gap 58 is formed between the substrate P and the plate member 57. The detecting light beam La3, which is radiated onto the gap 58, has such a possibility that the detecting light beam La3 is not received at a predetermined light intensity by the light-receiving system 72 although the liquid immersion area AR is formed satisfactorily. In this case, an inconvenience arises such that the control unit CONT stops the exposure process on the basis of the output of the light-receiving system 72. An arrangement, in which the plate member 57 is not provided, is also conceived. However, in such an arrangement, the difference in height is formed between the substrate P and the substrate stage PST (Z stage 51), and there is such a possibility that the detecting light beams La3, La4, La5 or the like, which are radiated onto portions disposed outside the substrate P, are not received by the light-receiving system 72 at predetermined light intensities, although the liquid immersion area AR is formed on the substrate P in the vicinity of the edge section E.

In this case, the control unit CONT controls the exposure operation on the basis of the result of the measurement performed by the laser interferometer 55 (see FIG. 1) for measuring the position of the substrate stage PST for supporting the substrate P, and the position information about the edge section E of the substrate P (gap 58) in the stage coordinate system prescribed by the laser interferometer 55. Specifically, for example, the control unit CONT previously determines the position information about the edge section E of the substrate P (gap 58) in the stage coordinate system to store the position information in the memory unit MRY beforehand, for example, during the alignment process performed before the exposure process. Subsequently, the control unit CONT performs the exposure process while measuring the position information about the substrate P by using the laser interferometer 55. During the exposure process, the control unit CONT judges whether or not the detecting light beam La is radiated onto portions disposed in the vicinity of the edge section E of the substrate P including the gap 58 with reference to the position information about the edge section E of the substrate P stored in the memory unit MRY. For example, if it is judged that the detecting light beam La is radiated onto the gap 58, then the control unit CONT neglects the output of the light-receiving system 72 to continue the exposure process, even when a situation arises such that the light amount of the detecting light beam La received by the light-receiving system 72 is lowered or the detecting light beam La is not received. By doing so, it is possible to avoid the inconvenience which would be otherwise caused such that the exposure process is stopped although the liquid immersion exposure process is satisfactorily performed.

FIG. 14 shows another embodiment of the present invention. This embodiment is characterized in that optical members 81, 82, through which the detecting light beam La of the focus-detecting system 70 is transmissive, are provided integrally with the optical element 60 of the projection optical system PL. A part or all of the detecting light beams La, which are included in the plurality of detecting light beams La projected from the projecting system 71 of the focus-detecting system 70, are designed to pass through a part of the optical element 60 (tip section) of the plurality of optical elements for constructing the projection optical system PL. The focus-detecting system 70 projects the detecting light beams La onto the substrate P through the optical element 60. Even in the case of the system as described above, the focus-detecting system 70 can detect the presence or absence of the gas portion in the optical path for the exposure light beam EL. In FIG. 14, the respective lower end surfaces (liquid contact surfaces) of the optical members 81, 82 are flat surfaces which are substantially parallel to the XY plane, and they have approximately the same height as that of the tip surface (lower end surface) of the optical element 60. The liquid 50 of the liquid immersion area AR makes tight contact with the lower end surfaces of the optical members 81, 82 and the lower end surface of the optical element 60. The liquid immersion area AR is formed in a wide area between the projection optical system PL and the substrate P.

As shown in FIG. 15, if a bubble 18 is present in the liquid 50 of the liquid immersion area AR, the detecting light beam La, which is emitted from the projecting system 71, collides with the bubble 18 to cause, for example, the scattering in the same manner as in the embodiment described above. Therefore, the detecting light beam La is received by the light-receiving system 72 in a state in which the light intensity is lowered. Accordingly, the focus-detecting system 70 can detect the presence or absence of the bubble (gas portion) 18 in the optical path for the exposure light beam EL and the optical path for the detecting light beam La in the liquid immersion area AR, on the basis of the output of the light-receiving system 72.

Also in this case, the respective optical members 81, 82 may be constructed with mutually independent members. Alternatively, the optical member 81, 82 may be formed annularly integrally to surround the optical element 60 disposed at the tip section of the projection optical system PL.

As described above, pure water is used as the liquid 50 in the embodiments of the present invention. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, the pure water is also expected to have the function to wash the surface of the substrate P and the surface of the optical element provided at the tip surface of the projection optical system PL.

It is reported that the refractive index n of pure water (water) with respect to the exposure light beam EL having a wavelength of about 193 nm is approximately in an extent of 1.44 to 1.47. When the ArF excimer laser beam (wavelength: 193 nm) is used as the light source of the exposure light beam EL, then the wavelength is shortened on the substrate P by 1/n, i.e., to about 131 to 134 nm, and a high resolution is obtained. Further, the depth of focus is magnified about n times, i.e., about 1.47 to 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In the embodiments of the present invention, the lens 60 is attached to the tip of the projection optical system PL. However, the optical element, which is attached to the tip of the projection optical system PL, may be an optical plate which is usable to adjust the optical characteristics of the projection optical system PL, for example, the aberration (for example, spherical aberration and comatic aberration). Alternatively, the optical element may be a parallel plane plate through which the exposure light beam EL is transmissive. When the optical element, which makes contact with the liquid 50, is the parallel plane plate which is cheaper than the lens, it is enough that the parallel plane plate is merely exchanged immediately before supplying the liquid 50 even when any substance (for example, any silicon-based organic matter), which deteriorates the transmittance of the projection optical system PL, the illuminance of the exposure light beam EL on the substrate P, and the uniformity of the illuminance distribution, is adhered to the parallel plane plate, for example, during the transport, the assembling, and/or the adjustment of the exposure apparatus EX. An advantage is obtained such that the exchange cost is lowered as compared with the case in which the optical element to make contact with the liquid 50 is the lens. That is, the surface of the optical element to make contact with the liquid 50 is dirtied, for example, due to the adhesion of scattered particles generated from the resist by being irradiated with the exposure light beam EL or any impurity contained in the liquid 50. Therefore, it is necessary to periodically exchange the optical element. However, when the optical element is the cheap parallel plane plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 50, is large between the substrate P and the optical element disposed at the tip of the projection optical system PL, it is also allowable that the optical element is tightly fixed so that the optical element is not moved by the pressure, without allowing the optical element to be exchangeable.

In the embodiments of the present invention, the space between the projection optical system PL and the surface of the substrate P is filled with the liquid 50. For example, it is also allowable to adopt an arrangement in which the space is filled with the liquid 50 in such a state that a cover glass composed of a parallel flat plate is attached to the surface of the substrate P. In this arrangement, the cover glass also constitutes a part of the projection optical system PL. That is, the projection optical system includes all of the optical elements existing on the optical path for the exposure light beam EL between the mask M and the substrate P.

The liquid 50 is water in the embodiments of the present invention. However, the liquid 50 may be any liquid other than water. For example, when the light source of the exposure light beam EL is the $F_2$ laser, the $F_2$ laser beam is not transmitted through water. Therefore, in this case, those preferably usable as the liquid 50 may include, for example, fluorine-based oil and perfluoropolyether (PFPE) through which the $F_2$ laser beam is transmissive. Alternatively, other than the above, it is also possible to use, as the liquid 50, those (for example, cedar oil) which have the transmittance with respect to the exposure light beam EL, which have the refractive index as high as possible, and which are stable against the photoresist applied to the surface of the substrate P and the projection optical system PL.

In the respective embodiments described above, the shape of the nozzle is not specifically limited. For example, two pairs of the nozzles may be used to supply or recover the liquid 50 for the long side of the tip section 60A. In this arrangement, the supply nozzles and the recovery nozzles may be arranged while being aligned vertically in order that the liquid 50 can be supplied and recovered in any one of the directions of the +X direction and the −X direction.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

In the embodiments described above, the exposure apparatus is adopted, in which the space between the projection optical system PL and the substrate P is locally filled with the liquid. However, the present invention is also applicable to a liquid immersion exposure apparatus in which a stage retaining a substrate as an exposure objective is moved in a liquid bath, and a liquid immersion exposure apparatus in which a liquid pool having a predetermined depth is formed on a stage and a substrate is retained therein. The structure and the exposure operation of the liquid immersion exposure apparatus in which the stage retaining the substrate as the exposure objective is moved in the liquid bath are described in detail, for example, in Japanese Patent Application Laid-open No. 6-124873. The structure and the exposure operation of the liquid immersion exposure apparatus in which the liquid pool having the predetermined depth is formed on the stage and the substrate is retained therein are described in detail, for example, in Japanese Patent Application Laid-open No. 10-303114 and U.S. Pat. No. 5,825,043, contents of which are incorporated herein by reference respectively within a range of permission of the domestic laws and ordinances of the state designated or selected in this international application.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

The present invention is also applicable to a twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference respectively within a range of permission of the domestic laws and ordinances of the state designated or selected in this international application.

As for the type of the exposure apparatus EX, the present invention is not limited to the exposure apparatus for the semiconductor production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, the adjustments performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 16:
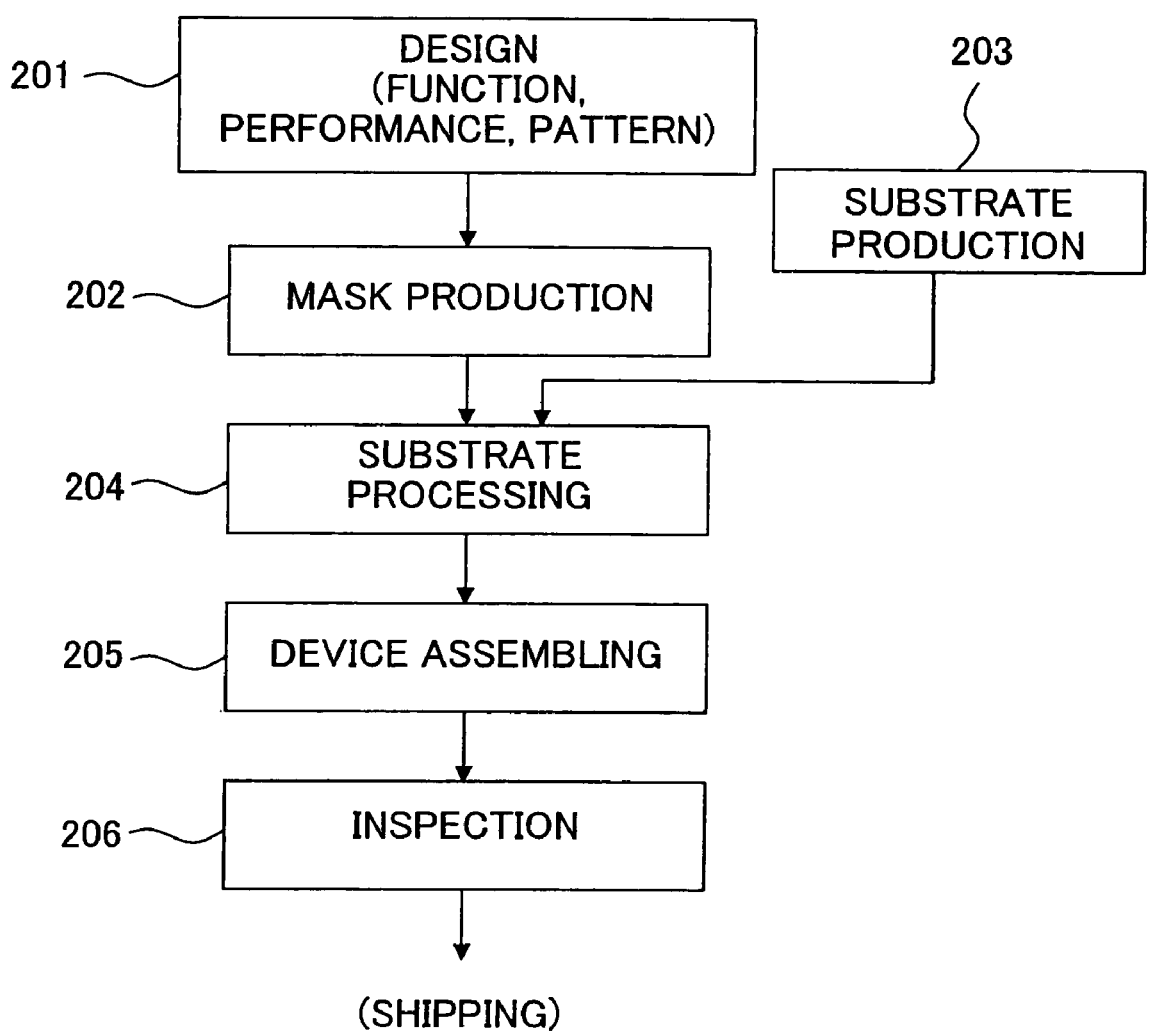
FIG. 16 shows a flow chart illustrating exemplary steps of producing a semiconductor device.

As shown in FIG. 16, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step of assembling the device (including a dicing step, a bonding step, and a packaging step) 205, and an inspection step 206.

According to the present invention, when the exposure process is performed on the basis of the liquid immersion method, it is possible to detect the gas portion including the bubble in the liquid in the space between the projection optical system and the substrate, the portion greatly relating to the pattern transfer accuracy, by using the bubble detector or the gas-detecting system. It is also possible to detect whether or not the liquid is discontinued between the projection optical system and the substrate and whether or not the image plane side of the projection optical system is filled with the liquid sufficiently for the exposure and the measurement. An appropriate treatment can be applied on the basis of the result of the detection in order to maintain the good productivity.

What is claimed is:

1. A liquid immersion type exposure apparatus comprising:
   an optical member through which an exposure beam passes;
   a flow passage in which a liquid flows, the flow passage being separate from, and in fluidic communication with, a space between the optical member and an object opposite to the optical member; and
   a detection system which determines a condition of the space between the optical member and the object based on a detected liquid flow condition within the flow passage.

2. The apparatus according to claim 1, wherein the detection system determines whether the space is filled with the liquid.

3. The apparatus according to claim 2, wherein the object is movable relative to the optical member.

4. The apparatus according to claim 3, wherein the object includes a substrate having a resist coating.

5. The apparatus according to claim 4, wherein the detection by the detection system is performed during exposure of the substrate.

6. The apparatus according to claim 5, wherein the detection system determines whether the exposure has been performed effectively or not, on the basis of the determined condition of the space.

7. The apparatus according to claim 6, wherein the exposure is effectively performed in a condition in which the space is filled with the liquid.

8. The apparatus according to claim 5, wherein the detection system determines whether the exposure can be started effectively or not, on the basis of the determined condition of the space.

9. The apparatus according to claim 2, wherein the detection system includes a flow rate meter that detects a flow rate of the liquid through the flow passage.

10. The apparatus according to claim 9, wherein the liquid is supplied to the space through the flow passage.

11. The apparatus according to claim 2, wherein the liquid is supplied to the space through the flow passage.

12. The apparatus according to claim 1, wherein the detection system includes a flow rate meter that detects a flow rate of the liquid through the flow passage.

13. The apparatus according to claim 12, wherein the object is movable relative to the optical member.

14. The apparatus according to claim 13, wherein the object includes a substrate having a resist coating.

15. The apparatus according to claim 14, wherein the detection by the detection system is performed during exposure of the substrate.

16. The apparatus according to claim 15, wherein the detection system determines whether the exposure has been performed effectively or not, on the basis of the determined condition of the space.

17. The apparatus according to claim 14, wherein the detection system determines whether the exposure can be started effectively or not, on the basis of the determined condition of the space.

18. The apparatus according to claim 12, wherein the liquid is supplied to the space through the flow passage.

19. The apparatus according to claim 1, wherein the liquid is supplied to the space through the flow passage.

20. The apparatus according to claim 19, wherein the object is movable relative to the optical member.

21. The apparatus according to claim 20, wherein the object includes a substrate having a resist coating.

22. The apparatus according to claim 21, wherein the detection by the detection system is performed during exposure of the substrate.

23. The apparatus according to claim 22, wherein the detection system determines whether the exposure has been performed effectively or not, on the basis of the determined condition of the space.

24. The apparatus according to claim 21, wherein the detection system determines whether the exposure can be started effectively or not, on the basis of the determined condition of the space.

25. The apparatus according to claim 1, further comprising a liquid immersion system which has the flow passage, and which is configured to fill the space with the liquid.

26. The apparatus according to claim 25, wherein the liquid immersion system has a supply outlet from which the liquid is supplied to fill the space, and the object is movable relative to the supply outlet of the liquid immersion system.

27. The apparatus according to claim 26, wherein the liquid immersion system has a recovery inlet from which the liquid is recovered, and the object is movable relative to the recovery inlet of the immersion system.

28. The apparatus according to claim 26, wherein the supply outlet is connected to the flow passage.

29. The apparatus according to claim 25, wherein the object includes a substrate having a resist coating, and the liquid of the space partially covers a surface on one side of the substrate.

30. The apparatus according to claim 25, wherein the detection system determines whether the space is filled with the liquid.

31. The apparatus according to claim 25, wherein the detection system includes a flow rate meter that detects a flow rate of the liquid through the flow passage.

32. The apparatus according to claim 1, wherein the object includes a substrate having a resist coating.

33. A liquid immersion exposure method comprising:
determining a condition of a space between an optical member and a substrate opposite to the optical member based on a detected flow condition of a liquid in within a flow passage which is separate from, and in fluidic communication with, the space; and
exposing the substrate with an exposure beam via the optical member and the space.

34. The method according to claim 33, wherein the determining is performed during the exposure of the substrate.

35. The method according to claim 34, further comprising:
determining whether the exposure has been performed effectively or not, on the basis of the determined condition of the space.

36. The method according to claim 33, further comprising:
determining whether the exposure can be started effectively or not, on the basis of the determined condition of the space.

37. The method according to claim 33, wherein the determining includes determining whether the space is filled with the liquid.

38. The method according to claim 37, wherein the determining is performed using a flow rate meter that detects a flow rate of the liquid through the flow passage.

39. The method according to claim 38, wherein the liquid is supplied to the space through the flow passage.

40. The method according to claim 33, wherein the determining is performed using a flow rate meter that detects a flow rate of the liquid through the flow passage.

41. The method according to claim 40, wherein the liquid is supplied to the space through the flow passage.

42. The method according to claim 33, wherein the liquid is supplied to the space through the flow passage.

43. A device manufacturing method comprising:
determining a condition of a space between an optical member and a substrate opposite to the optical member based on a detected flow condition of a liquid within a flow passage which is separate from, and in fluidic communication with, the space;
exposing the substrate with an exposure beam via the optical member and the space; and
processing the exposed substrate.

44. A method for making a liquid immersion type exposure apparatus, the method comprising:
providing an optical member via which an exposure beam passes;
providing a flow passage in which a liquid flows, the flow passage being separate from, and in fluidic communication with1 a space between the optical member and an object opposite to the optical member; and
providing a detection system which determines a condition of the space between the optical member and the object based on a detected liquid flow condition within the flow passage.

45. The method according to claim 44, wherein the object includes a substrate having a resist coating.

46. The method according to claim 44, wherein the determining includes determining whether the space is filled with the liquid.

47. The method according to claim 44, wherein the detection system includes a flow rate meter that detects a flow rate of the liquid through the flow passage.

48. The method according to claim 44, wherein the liquid is supplied to the space through the flow passage.

49. A liquid immersion type exposure apparatus comprising:
an optical member through which an exposure beam passes;
a flow passage in which a liquid flows, the flow passage being separate from, and in fluidic communication with, a space between the optical member and an object opposite to the optical member; and
means for determining a condition of the space between the optical member and the object based on a detected liquid flow condition within the flow passage.

* * * * *